United States Patent
Brun et al.

(10) Patent No.: US 9,437,468 B2
(45) Date of Patent: Sep. 6, 2016

(54) HEAT ASSISTED HANDLING OF HIGHLY WARPED SUBSTRATES POST TEMPORARY BONDING

(71) Applicant: Intel Corporation, Santa Clara, CA (US)

(72) Inventors: Xavier F. Brun, Chandler, AZ (US); Huan Ma, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 14/229,902

(22) Filed: Mar. 29, 2014

(65) Prior Publication Data

US 2015/0279718 A1    Oct. 1, 2015

(51) Int. Cl.
   *H01L 21/67*   (2006.01)
   *H01L 21/683*   (2006.01)
   *H01L 21/02*   (2006.01)

(52) U.S. Cl.
   CPC ....... *H01L 21/6838* (2013.01); *H01L 21/0209* (2013.01); *H01L 21/67028* (2013.01); *H01L 21/6835* (2013.01); *H01L 21/6836* (2013.01); *H01L 2221/6834* (2013.01); *H01L 2221/68327* (2013.01); *H01L 2221/68381* (2013.01); *Y10T 156/1132* (2015.01)

(58) Field of Classification Search
   CPC .................................................. H01L 21/67
   See application file for complete search history.

(56) References Cited

U.S. PATENT DOCUMENTS

| | | | |
|---|---|---|---|
| 6,219,219 B1 | 4/2001 | Hausmann et al. | |
| 6,572,708 B2 | 6/2003 | Gujer et al. | |
| 2012/0132412 A1* | 5/2012 | Yamamoto | H01L 21/67109 165/287 |
| 2014/0099485 A1* | 4/2014 | Narendrnath | H01L 21/67092 428/201 |

\* cited by examiner

*Primary Examiner* — Mohammad Choudhry
(74) *Attorney, Agent, or Firm* — Blakely, Sokoloff, Taylor & Zafman LLP

(57) ABSTRACT

A heated non-contact wafer handling gripper may heat a thin device wafer bottom surface having a temporary bonding adhesive residue after debonding of the device wafer from a carrier along a layer of temporary bonding adhesive that bonds the wafers. The gripper may heat residue of the adhesive that remains on the bottom surface while gripping, transferring and placing the wafer onto an adhesive cleaning chuck. The heated adhesive cleaning chuck may heat the thin device wafer bottom surface having the adhesive residue after being placed on the chucks. The chuck may heat the residue of the adhesive while the residue is cleaned from the wafer. Due to the heating by the chuck and/or gripper, wafer warpage and associated problems due to cooling of the residue may be eliminated or acceptable for wafer handling and adhesive cleaning.

20 Claims, 14 Drawing Sheets

HEAT ASSISTED HANDLING OF HIGHLY WARPED SUBSTRATES POST TEMPORARY BONDING

FIELD

Embodiments of the invention are related to a heated non-contact wafer handling gripper to grip and transfer thin device wafers being impacted by wafer warpage after debonding from a carrier. Embodiments are also related to a heated adhesive cleaning chuck to clean bonding adhesive from thin device wafers being impacted by wafer warpage after debonding. Other embodiments are also described.

BACKGROUND

In the processing of semiconductor devices, such as transistors, diodes and integrated circuits, a plurality of semiconductor devices are fabricated simultaneously on a thin slice of semiconductor material called semiconductor "device" wafer or electronic device wafer. Such a semiconductor wafer may be thin enough to be susceptible to warpage due to thermal changes. Thus, during the manufacturing of semiconductor integrated circuits, care should be taken to enable handling of highly warped wafers (e.g., wafers being impacted by cooling) without damage to the wafer.

Various known techniques enable the handling of device wafers without human intervention. Some known wafer handling devices make use of a "vacuum" or gas flow generated holding force to hold (e.g., "grip") the wafer without contact with a pickup surface of the device. However, such non-contact holding may result in possible damage at room temperature due to increased warpage of the wafer, particularly when wafer thickness is reduced.

For example, prior to dicing a device wafer into separate die or chips, the device wafer may be separated or "debonded" from a carrier upon which it is bonded, along a layer of adhesive that bonds the wafers. In some cases, a debonding operation is carried out to separate the device wafer from the carrier through thermal slide mechanism to slide the wafers apart laterally along the adhesive. After debonding, a non-contact wafer handling gripper or chuck may be used to handle the wafer using gas emitting pods (such as divergent or vortex nozzle type emitting pods) to create low pressure regions (e.g., below atmospheric pressure) at the surface of the wafer, which provide a holding force.

However, some wafers may experience warpage during or after handling by the gripper. Therefore, there exists a need for handling semiconductor wafers while substantially minimizing warpage of device wafers being handled after debonding from a carrier, and during cleaning of the bonding adhesive from thin device wafers.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

There are a number of non-trivial issues associated with handling of electronic device fabrication wafers without human intervention. Various known techniques enable the handling of wafers without human intervention. Some known wafer handling devices make use of vacuum to hold (e.g., "grip") the wafer without contact with a pickup surface of the device. However, such a non-contact holding may result in possible damage or warpage of the wafer.

Figure 1A:
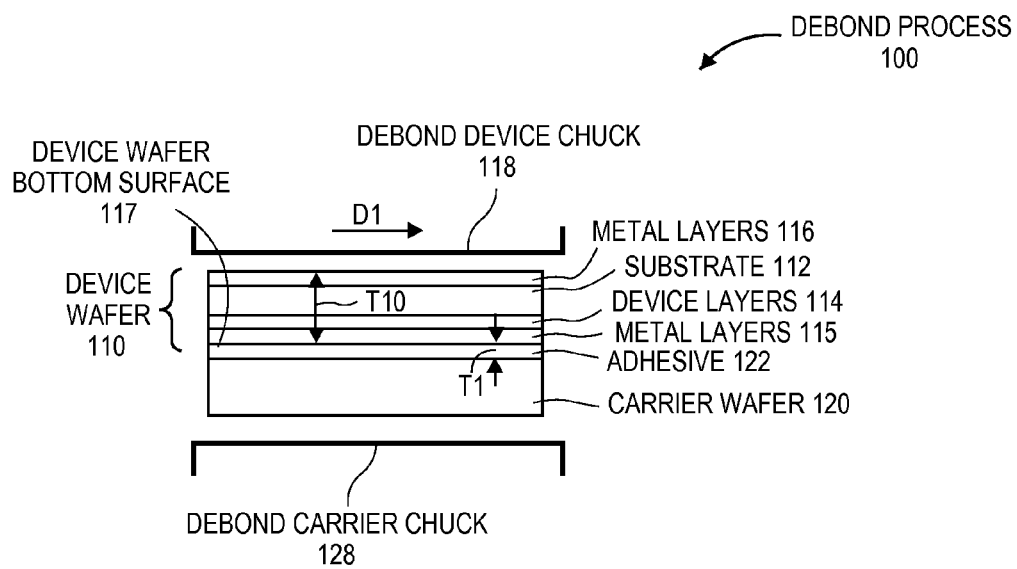
FIG. 1A is a schematic cross-sectional view of a debonding process for debonding an electronic device wafer from a carrier along a layer of adhesive that bonds the wafers.

For example, prior to dicing a device wafer into separate die or chips, the device wafer may be separated or "debonded" from a carrier upon which it is bonded, along a layer of adhesive that bonds the wafers (e.g., see FIG. 1A). In some cases, a debonding operation is carried out to separate the device wafer from the carrier, which were bonded together with a layer of adhesive, through thermal slide mechanism to slide the wafers apart laterally along the adhesive. Debonding may include two handlers, one holding the carrier and another handler handling the device wafer. Residual adhesive may remain on the top surface of the carrier and along the bottom surface of the device wafer.

Figure 1B:
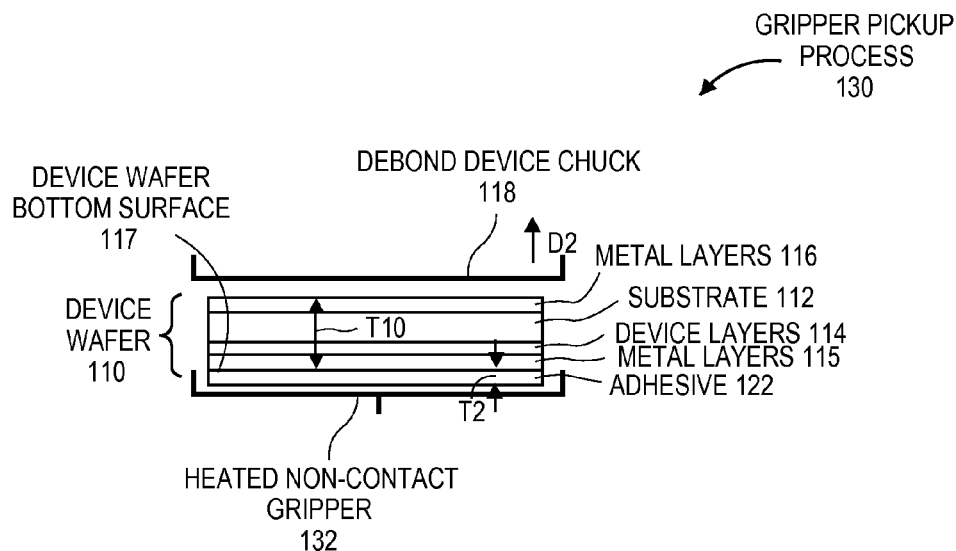
FIG. 1B shows the electronic device wafer of FIG. 1A after debonding and during heated gripper pickup of the bottom surface of the device wafer having adhesive.

After debonding, a non-contact wafer handling gripper or chuck may be used to handle the wafer using gas (e.g., Nitrogen) emitting pods to create low pressure regions at the surface of the wafer, which provide a holding force to "grip" the wafer (e.g., see FIG. 1B). However, as thin wafers cool, they may experience increased warpage during or after handling by the gripper.

One main contributor of post debond wafer increased warpage is the solidified adhesive layer. If adhesive layer could be kept at the un-harden (soft) state, impact to increased warpage could be minimized. Embodiments described herein reduce wafer warpage post debond by leveraging the material properties of the adhesive. Therefore heating the wafer during wafer handling above or near a glass transition temperature (Tg) will help keeping adhesive on wafer in the un-harden (soft) state until wafer transfer is completed. Consequently, wafer cool down while being held flat on a vacuum chuck so that the wafer warpage (e.g., due to adhesive cooling) is reduced.

In some cases, the wafer is floating near the gripper surface having the pods (e.g., the chuck plate), and is centered by guides on the gripper or chuck edge. When the gas is emitted at room temperature it quickly cools the device wafer during the wafer transportation to the cleaning module chuck. For thin wafers, this may result in increased shrinkage (e.g., compression) of the adhesive and bonding of the adhesive to the bottom surface of the device wafer, which may cause high (e.g., unacceptable) wafer warpage (e.g., due to adhesive cooling, see FIG. 1C).

The device wafer may then be flipped or inverted, and placed on an adhesive cleaning chuck. The cleaning chuck may use a vacuum to hold the wafer and keep it from warping while solvent is applied to the adhesive from above and washes the adhesive away. However, when the wafer is placed or dropped on the cleaning module chuck (e.g., see FIG. 1E), the cooled adhesive may cause high warpage of the wafer which leads to vacuum loss at the chuck, and fully automated operation, such as cleaning or removal of the adhesive from the wafer at a cleaning chuck (e.g., see FIG. 1G) cannot be completed (e.g., see FIG. 1F).

To reduce, avoid or eliminate such warpage and associated problems, some embodiments of the invention use a heated non-contact wafer handling gripper to grip and transfer (e.g., pick up, gripping, transport and/or handling) of thin device wafers being impacted by wafer warpage after debonding from a carrier (e.g., see FIG. 1B). To reduce, avoid or eliminate such warpage and associated problems, some embodiments of the invention use a heated adhesive cleaning chuck to clean bonding adhesive from thin device wafers being impacted by wafer warpage after debonding (e.g., see FIG. 1G). These embodiments may be combined to reduce wafer warpage due to adhesive cooling after debonding. These embodiments may be applied to wafers, substrates, or panels (e.g., wafers bonded to other wafers, which may be by a temporary bond). The embodiments herein may generally be described as heat assisted handling (e.g., using the heated gripper and/or heated cleaning chuck) of highly warped substrates (e.g., wafers, substrates, or panels), post temporary bonding (e.g., of a wafer, substrate, or panel to another wafer, substrate, or panel).

According to some embodiments, a temporary bond is a bond between a wafer (e.g., a device wafer) and a carrier (such as using a temporary bonding adhesive) where the wafer is mounted on a carrier prior to thinning the device and/or other wafer fabrication process (e.g., through silicon via (TSV) forming or processes). Once the wafer is thinned and/or processed, the wafer is or can be debonded from the carrier (e.g., see FIGS. 1A, 1B, 1D, 1E and 1G) and the temporary bonding adhesive (which is designed to be) can be dissolved off of the surface of the wafer by a solvent or other liquid in the cleaning process (e.g., upon a cleaning chuck) (e.g., see FIG. 1H).

In some cases, in a temporary bonding process, the wafer (e.g., a device wafer) is mounted on a carrier with a temporary bonding adhesive. Then the wafer is thinned, and processed to form through silicon vias and/or other features. After the thinning and processing, the wafer is debonded from the carrier (e.g., see FIGS. 1A and 1B), transferred and placed on a cleaning chuck (e.g., see FIGS. 1D, 1E and 1G). Then, the temporary bonding adhesive is dissolved off of the wafer by a solvent or other liquid in a cleaning process while the wafer is upon the cleaning chuck (e.g., see FIG. 1H).

In some cases, to handle the device wafer post debond, a heated chuck is used to keep the adhesive on wafer at the un-hardened state by heating the adhesive to at least above 0.5 times Tg of the adhesive, and the wafer is allowed to cool down only after it is being held flat on the cleaning module chuck. In this way, wafer warpage during handling is minimized and sufficient vacuum can be achieved at the cleaning module's chuck and cleaning process can proceed. In some cases the wafer continues to be heated by the chuck.

FIG. 1A is a schematic cross-sectional view of a debonding process for debonding an electronic device wafer from a carrier along a layer of adhesive that bonds the device wafer to the carrier. FIG. 1A shows debond process 100 including debond device chuck 118 gripping or in physical contact with top surface of device wafer 110 and debond carrier chuck 128 gripping or in physical contact with bottom surface of carrier 120, for debonding wafer 110 from carrier 120, such as along a layer of adhesive 122 that bonds the device wafer to the carrier. Process 100 may be or include a thermal slide debond of device wafer 110 from carrier 120, such as is know. In some cases, wafer 110 represents a device wafer, a device substrate or a device. In some cases, carrier 120 represents a carrier wafer, a carrier substrate or a carrier panel; or a temporary carrier wafer, a temporary carrier substrate or a temporary carrier panel (e.g., upon which a device wafer, a substrate or a panel is held or mounted, and then removed from). Using embodiments of a heated gripper and/or heated cleaning chuck as described herein provides a process capable of successfully handling wafers after thermal slide debonding, which is a debonding that may be cheaper than other debonding processes, such room temperature debonding processes that use more complex carrier preparation, more expensive adhesives, mounting of the device wafer on dicing tape before debond, or slower debond throughput. It also allows the wafer to be debonded, the adhesive to be cleaned, and a filmed or dicing tape to be applied to the wafer for dicing the wafer into chips. The dicing tape may be a multilayer plastic sheet made of, for example, polyester film, stretched polyester film, or polyethylene terephthalate (PET).

Chuck 118 may grip wafer 110 by forming a gripping force such as a vacuum, electrostatic chuck (ESC) attraction, or other appropriate gripping force between the top surface of wafer 110 and debond carrier chuck 128. In some cases, the gripping force includes a force from vacuum channels or a porous surface (e.g., gripping surface) of the chuck, such as created by sucking in air or ambient gas through the vacuum channels or a porous surface. In some cases, the gripping force is a vacuum force created by sucking in air or ambient gas (e.g., air) through openings in the surface of the chuck facing wafer 110. Chuck 128 may grip carrier 120 by a process similar to that described above for chuck 118 and wafer 110.

In some cases, wafer 110 may be or include a through silicon via (TSV) wafer. In some cases, wafer 110 may include device layers (or layer) 114 of electronic devices on a bottom surface of substrate 112, metal layers 115 having bottom surface 117 is below electronic device layers 114, and metal layers 116 is above or over substrate 112. According to embodiments, adhesive layer 122 is adhered to, laminated on, formed on or adhered to surface 117 of layer 115. In some cases, carrier 120 represents a semiconductor, TSV, glass or other type of carrier.

Substrate 112 may be single crystal silicon substrate having a (100), (111), or (110) Miller Index along its bottom surface upon which layer 114 is formed. Layer of devices 114 may include semiconductor devices, such as transistors, diodes, resistors, capacitors, inductors, and integrated circuits that are fabricated simultaneously on substrate 112 which may be a thin slice of semiconductor material, such as silicon. Wafer 110 or layer of devices 114 may represent or be layers that are included in a functional or functioning transistor. In some cases, wafer 110 or layer of devices 114 may represent or be layers that are included in a structure that will be further processed to form a functional or functioning transistor.

Metal layers 115 may be or include one or more metal layers such as contacts of through silicon vias (TSV) or metal interconnects or contacts (e.g., on bottom or posterior surface of wafer 110). Metal layers 116 may be or include one or more metal layers such as contacts of through silicon vias (TSV) (in some cases, connected to TSV of layer 115) or metal interconnects or contacts (e.g., on top or posterior surface of wafer 110).

Although metal layers 115 and 116 are described as the bottom and top layers having the bottom and top surfaces of wafer 110, it is understood that wafer 110 may have a different top layer (or surface) and bottom layer (or surface) instead of layers 115 and 116; or a top layer and bottom layer surface above and below layers 116 and 115 (respectively). Wafer 110 may thin enough to be susceptible to warpage during cooling of the wafer (e.g., metal layers) after debond, and/or due to compression caused by or during cooling of adhesive layer 122.

According to embodiments, wafer 110 may be a "standard" device wafer (e.g., a subset of TSV wafers) without metal layer 116, but having layers 112, 114, 115 and 122. In this cases, wafer 110 may not be or include a through silicon via (TSV) wafer. Here, wafer 110 would include device layers (or layer) 114 of electronic devices on a bottom surface of substrate 112, metal layers 115 having bottom surface 117 is below electronic device layers 114, but exclude metal layers 116 above or over substrate 112. According to these embodiments, adhesive layer 122 is adhered to, laminated on, formed on or adhered to surface 117 of layer 115.

In some cases, wafer 110 will have thickness T10 (e.g., from top surface of metal layer 116 or another top surface of the wafer to bottom surface 117) of between 20 and 800 micrometers (um). In some cases, T10 is less than 200 um (or between 200 and 20 um). In some cases, T10 is less than 50 um (or between 50 and 20 um, which may be described as an "ultrathin wafer"). In some cases, wafer 110 will have a thickness T10 of less than 122 micrometers (um) (or between 122 and 20 um, which may be described as a "thin wafer"). In some cases, wafer 110 will have a thickness of 50, 62, 72, 82, 92, 102, 112 or 122 micrometers (um). In some cases, wafer 110 will have a thickness of between 92 and 122 micrometers (um). In some cases, wafer 110 will have a diameter of between 18 and 450 millimeters (mm).

Adhesive 122 may include or be a layer of temporary bonding adhesive below surface 117 (e.g., metal layers 115) and above carrier 120. Adhesive may be touching, bonded to, or attached to surface 117 and a top surface of carrier 120 sufficiently for processing performed on wafer 110 to form device layer 114 and or layers 116 and 115, prior to debonding. Adhesive 122 may have thickness T1 at surface 117. Adhesive 122 may be or include a polymer material, a material that has a polymer material property, or a thermoplastic material. In some cases the adhesive is or includes a high temperature polymer adhesive material, adhesive material that has a polymer material property, or adhesive thermoplastic material, that is used as known in the art, to bond device and carrier. A glass transition temperature (Tg) may be defined for adhesive 122.

Adhesive 122 may have a heating differential scanning calorimetry (DSC) curve showing Tg, such as a Tg, which is characteristic of the material of or included in adhesive 122. In some cases adhesive 122 can be a chosen, selected or predetermined material to have a Tg as desired to provide a sufficient or desired heating threshold from the gripper or cleaning chuck to reduce or eliminate warpage of wafer 110 due to cooling, considering other processing or design factors relevant to handling or processes described for FIGS. 1-2. In some cases adhesive 122 has a Tg of between of between 50 and 150 degrees Celsius. In some cases adhesive 122 has a Tg of between 50 and 1000 degrees Celsius. In some cases adhesive 122 has a Tg of between 50 and 300 degrees Celsius. In some cases adhesive 122 has a Tg of between 50 and 150 degrees Celsius. In some cases the adhesive 122 has a Tg of between 60 and 100 degrees Celsius.

Process 100 may include thermo-slide debonding electronic device wafer 110. Process 100 may include debonding wafer 110 from carrier 120, by separating the wafer from the carrier along layer of adhesive 122 using debond chuck 118 contacting or attached to a top surface and/or sides of the device wafer 110 to slide the device wafer in direction D1 away from the carrier 120 along the adhesive, and using debond chuck 128 contacting or attached to a bottom surface and/or sides of the carrier 120 to hold the carrier at a fixed location with respect to direction D1. It can be appreciated that in another embodiment, chuck 128 may be moved while chuck 118 is held at a fixed location. In some cases, the wafer and carrier are slid by moving the debond chucks relative to each other in direction D1 to put a force on the sides of the wafer relative to direction D1. Thus, device wafer 110 may be separated or "debonded" from carrier 120 upon which it was bonded, but residual adhesive (e.g., a layer of adhesive) may remain on the top surface of the carrier and along the bottom surface of the device wafer.

In some cases, during or after debonding 100, wafer 110 has a temperature between 50 and 300 degrees Celsius, such as due to heating during the debonding process. In some cases debonding may be at a temperature at which wafer 110 is held by chuck 118 without warpage. Heating during debonding may be maintained until wafer 110 is gripped by a heated gripper. At the termination of debonding, while the wafer is at this temperature, the heated gripper or handler may pick up the wafer.

FIG. 1B shows the electronic device wafer of FIG. 1A after debonding and during heated gripper pickup of the bottom surface of the device wafer having adhesive. FIG. 1B shows gripper pickup process 130 including debond device chuck 118 gripping or in physical contact with top surface of Device wafer 110 and heated non-contact gripper 132 gripping but not in physical contact with adhesive 122 or with bottom surface 117 of wafer 110, for moving or transferring wafer 110 away from, or off of chuck 118. In some cases, gripper 132 is described as a heated non-contact wafer handling gripper or a heated gas flow non-contact gripper. Such a gripper may have (e.g., pods with) divergent type (e.g., "Bernoulli") or vortex type (e.g., rotating flow) gas emitting nozzles. These nozzles may be part of "pods" disposed on a gripping surface used to grip the wafer (e.g., at or using gripping locations at the nozzles where a holding force or "vacuum" is formed). In some cases, the gas can be air or nitrogen. After debonding, adhesive 122 may have residual thickness T2 such as a remainder of adhesive 122 on surface 117 which is less than or equal to thickness T1. Residual thickness T2 may be a remainder of a portion of thickness T1 of adhesive 122 that does not end up as residue or remainder on the top surface of carrier 120.

Process 130 may include gripping bottom surface 117 having residual thickness T2 of adhesive 122 with heated gripper 132, by forming a vacuum (e.g., holding force) between the layer of adhesive or between surface 117 using pods of gripper 132 (e.g., pods 310 of FIG. 3A having openings 312) to emit a gas that is lighter than air, such as Nitrogen. The emitting pods may create low pressure regions (at the pods) at the surface of the wafer, which provide a holding force to "grip" the wafer (e.g., see FIG. 1B).

Gripper 132 gripping wafer 110 my also include centering the wafer on the surface of the gripper 132 using guides on the gripper edge (e.g., to maintain the wafer's lateral position with respect to the gripper). In some cases, the wafer is floating near the gripper surface having the pods (e.g., the chuck plate), and is centered by guides on the gripper or chuck edge (e.g., see guides 313 of FIG. 3A).

Process 130 may include using debond chuck 118 contacting or attached to a top surface and/or sides of the device wafer 110 while gripper 132 grips surface 117 (and adhesive 122). Process 130 may include releasing or removing wafer 110 from debond chuck 118 after gripper 132 grips surface 117 (and adhesive 122), such as by pulling wafer 110 down away from chuck 118, while chuck 118 is held at a vertical fixed location with respect to gripper 132. Process 130 may include releasing or removing wafer 110 from debond chuck by removing or discontinuing the holding force or "vacuum" between the top surface of wafer 110 and debond carrier chuck 128 described for FIG. 1A.

It can be appreciated that in another embodiment, chuck 118 may be moved upwards while gripper 132 is held at a fixed location. In some cases, chuck 118 and gripper 132 are pulled apart by moving the chuck relative to gripper 132 in direction D2 to pull chuck 118 from the top surface of wafer 110 relative to direction D2.

In some cases, Process 130 may include inverting or flipping over the device wafer using gripper 132 while transferring the device wafer with gripper 132. The transfer may be to transfer wafer 110 to an adhesive cleaning chuck, to dissolve or clean off the adhesive (and the cleaning chuck may also be heated).

As noted, process 130 may include gripper 132 gripping bottom surface 117 having residual thickness T2 of adhesive 122. Thus, device wafer 110 may be separated from chuck 118 upon which it was mounted or gripped, but residual adhesive 122 having thickness T2 (e.g., a layer of adhesive) may remain on or along bottom surface 117 of the device wafer. However, as thin wafers cool, they may experience warpage during or after handling by the gripper.

Figure 1C:
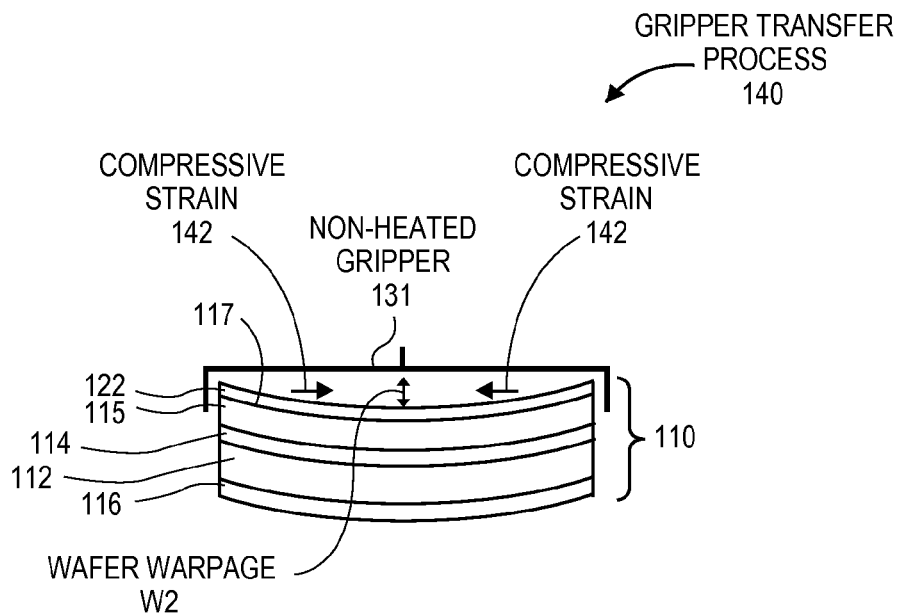
FIG. 1C shows the device wafer of FIG. 1B during non-heated gripper transfer of the wafer and having wafer warpage, such as due to cooling of the adhesive during transfer by the non-heated gripper.

FIG. 1C shows the device wafer of FIG. 1B during non-heated gripper transfer of the wafer and having wafer warpage, such as due to cooling of the adhesive during transfer by the non-heated gripper. This may include transfer process 140, transferring wafer 110 after inverting the wafer; or transferring the wafer and then inverting the wafer prior to depositing or dropping it onto another surface or chuck, such as an adhesive cleaning chuck.

Process 140 may include gripper 132 releasing bottom surface 117 having residual thickness T2 of adhesive 122. Thus, device wafer 110 may be separated from gripper 132 upon which it was mounted or gripped, but residual adhesive 122 having thickness T2 (e.g., a layer of adhesive) may remain on or along and exposed to the ambient at bottom surface 117 of the device wafer. However, as thin wafers cool, they may experience warpage during or after handling by the gripper.

FIG. 1C shows device wafer 110 during non-heated gripper 131 transfer 140 of the wafer and having wafer warpage W1 between the center of wafer 110 (e.g., a radial or lateral center, such as based on a top side view), such as due to cooling of the residue thickness T2 of adhesive 122 during transfer of wafer 110 by a non-heated gripper. In some cases, warpage W1 is due only to cooling of the residue thickness T2 of adhesive 122 (e.g., is not due to thermal differences between layers 115 and 116, or other factors). Process 140 may include gripper 131 gripping bottom surface 117 having residual thickness T2 of adhesive 122. In some cases, FIG. 1C shows device wafer 110 having compressive strain 142 causing wafer warpage W1 between the center of surface 117 of wafer 110 and bottom surface (e.g., surface 305) of gripper 131.

According to embodiments, when the gas is emitted from pods 310 at room temperature it quickly cools the device wafer during the wafer transportation to the cleaning module chuck. Room temperature may be between 20 and 30 degrees Celsius. For thin wafers (e.g., less than or equal to 122 um—micro meters), this may result in increased shrinkage (e.g., compression) of the adhesive and bonding of the adhesive to the bottom surface of the device wafer.

Gripper 131 transfer of wafer 110 may cause gripper transfer warpage W1 due to cooling, solidification, cool down, firming up to a non liquid, shrinkage, compressive strain, and/or adhering of adhesive 122 to bottom surface 117 of device wafer. For example, embodiments of gripper 131 may not be a heated gripper, or may not have the heating elements of a heated gripper activated or turned on. Thus, adhesive 122 may cool and/or dry, causing it to shrink and adhere to surface 117 of wafer 110. This shrinking and adhering may cause compressive strain 142 across the top surface of wafer 110, causing the wafer to warp inwards with wafer warpage W1 on the side that the adhesive is on. In this case, the adhesive may cool to room temperature, a temperature below Tg, or below another temperature which the heated gripper or cleaning chuck is described as heating the adhesive to. When cooled, the repeating units of material of the adhesive may remain stationary in tighter patterns at or below temperature (Tg), thus gripping surface 117 of wafer 110 (or a substrate) and pulling it with compressive force 142 which may or may not cause warpage W1. In some cases, warpage W1 does not occur while wafer 110 is held at room temperature by (non-heated) non-contact gripper 131, during the holding or "vacuum" force of gripper 131 on surface 117, but warpage does occur once wafer 110 is deposited or dropped onto another surface, such as onto cleaning chuck 152. Thus, although chuck 152 may attempt to or use a holding or "vacuum" force to grip or hold wafer 110, compressive force 142 may cause wafer 110 to warp, before or with sufficient force, that a holding or "vacuum" force of chuck 152 is not sufficient to hold or flatten out wafer 110 (e.g., see FIG. 1F).

Figure 1D:
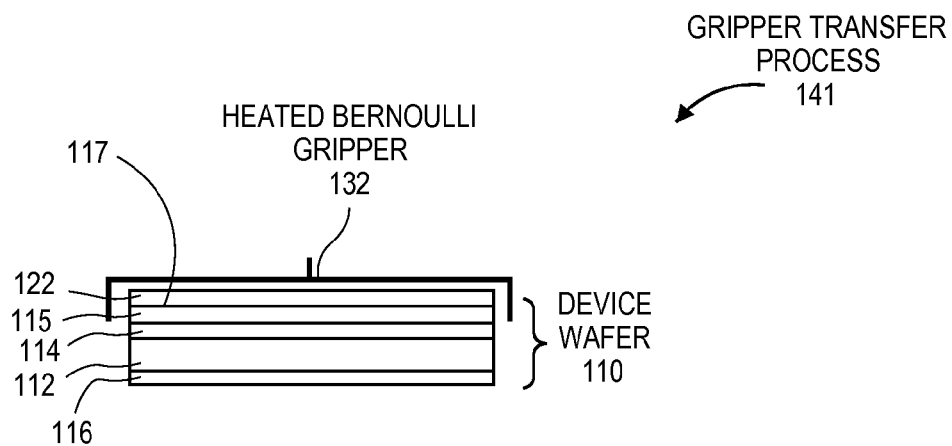
FIG. 1D shows the device wafer of FIG. 1B during heated gripper transfer of the wafer and having acceptable, reduced or no wafer warpage due to cooling of the adhesive during transfer by the gripper.
Figure 1E:
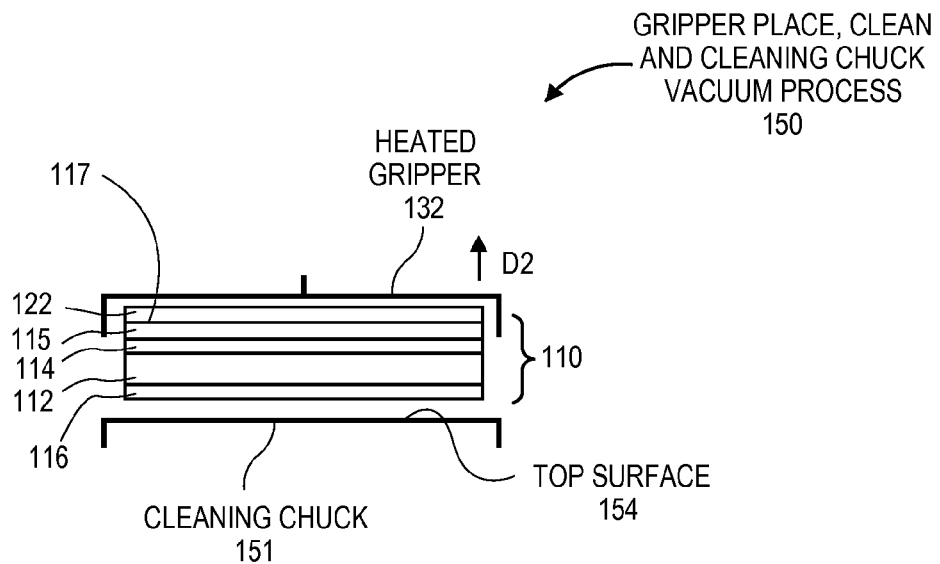
FIG. 1E shows the device wafer of FIG. 1B, 1C or 1D after placing, cleaning, and vacuum processing of the device wafer on an adhesive cleaning chuck.

For example, when wafer 110 is placed or dropped on the cleaning module chuck (e.g., top side down as shown in FIG. 1E), the cooled adhesive may cause high warpage of the wafer which leads to holding or "vacuum" loss at the chuck (see FIG. 1F), and fully-automated operation, such as cleaning or removal of the adhesive from the wafer at a cleaning chuck (e.g., see FIG. 1G) cannot be completed.

To reduce, avoid or eliminate such warpage and associated problems, some embodiments of the invention use a heated non-contact wafer handling gripper to grip and transfer (e.g., pick up, gripping, transport and/or handling) of thin device wafers being impacted by wafer warpage after debonding from a carrier (e.g., see FIG. 1B). To reduce, avoid or eliminate such warpage (e.g., see FIG. 1F) and associated problems (e.g., so the wafer is not being impacted by such warpage), some embodiments of the invention use a heated adhesive cleaning chuck to clean bonding adhesive from thin device wafers without wafer temporary bonding adhesive induced warpage by controlling such warpage after debonding (e.g., see FIGS. 1G and 1H). These embodiments may be combined to reduce wafer warpage due to adhesive cooling after debonding.

Although other factors may cause or contribute to wafer warpage (e.g., other than or in addition to W1) due to thermal or temperature changes, such as different thermal characteristics of metal layers 115 and 116, embodiments here may or may not reduce or elimination those factors.

FIG. 1D shows the device wafer of FIG. 1B during heated gripper transfer of the wafer and having acceptable, reduced or no wafer warpage due to cooling of the adhesive during transfer by the gripper. This may include transfer process 141, transferring wafer 110 after inverting the wafer; or transferring the wafer and then inverting the wafer prior to depositing or dropping it onto another surface or chuck, such as an adhesive cleaning chuck.

According to embodiments, as noted below, heated gripper 132 transfers wafer 110 while being heated sufficiently to reduce, avoid or eliminate such warpage and associated problems. In some cases, during or after process 141, wafer 110 has no warpage, has eliminated, has reduced as compared to descriptions for Figure C, or has "acceptable" warpage for forming a holding or "vacuum" force on chuck 151 or 152 (e.g., as noted below). In some cases, during or after process 141, wafer 110 has "acceptable" warpage, which is warpage less than warpage W1 between the center of wafer 110 and surface 305, such as warpage that is acceptable for gripping by chuck 156.

Process 141 may include gripper 132 releasing bottom surface 117 having residual thickness T2 of adhesive 122 as noted above for FIG. 1C. Process 141 may include gripper 132 gripping bottom surface 117 having residual thickness T2 of adhesive 122. In some cases, FIG. 1D shows device wafer 110 having no or acceptable compressive strain causing no or acceptable wafer warpage between the center of surface 117 of wafer 110 and bottom surface (e.g., surface 305) of gripper 132.

According to embodiments, due to heating of wafer 110 by gripper 132, when the gas is emitted from pods 310 at room temperature it does not cool the device wafer during the wafer transportation to the cleaning module chuck. Thus, for thin wafers (e.g., less than or equal to 122 um—micro meters), this emission does not result in increased shrinkage (e.g., compression) of the adhesive and bonding of the adhesive to the bottom surface of the device wafer, because the adhesive does not cool or dry sufficiently for such shrinkage and bonding.

Notably, gripper 132 transfer of wafer 110 may not cause gripper transfer warpage W1 due to cooling, solidification, cool down, firming up to a non liquid, shrinkage, compressive strain, and/or adhering of adhesive 122 to bottom surface 117 of device wafer. For example, for embodiments of gripper 132 that are a heated gripper (e.g., and that have the heating elements of the gripper activated or turned on) adhesive 122 may be heated or maintained at a temperature (e.g., not cool and/or dry) that does not cause it to shrink and adhere to surface 117 of wafer 110. This avoids shrinking and adhering that may cause compressive strain 142 across the top surface of wafer 110, causing the wafer to warp inwards with wafer warpage W1 on the side that the adhesive is on. Such heating may be heating to greater than room temperature, a percentage of Tg, or another temperature which the heated gripper or cleaning chuck is described as heating the adhesive to. Such heating may cause repeating units of material of the adhesive to move about randomly, such as in a fluid, thus not gripping surface 117 of the disk and pulling it with compressive force 142, and thus not causing warpage W1, but instead causing reduced, no or acceptable warpage. In some cases, warpage W1 does not occur during the holding or "vacuum" force of gripper 132 and surface 117, and does occur once wafer 110 is deposited or dropped onto another surface, such as onto cleaning chuck 152. Thus, chuck 152 may successfully attempt to or use a holding or "vacuum" force to grip or hold wafer 110, since compressive force 142 does not cause wafer 110 to warp a sufficient amount or with sufficient force that prohibits a holding or "vacuum" force of chuck 152 from holding or flattening out wafer 110 (e.g., see FIG. 1F).

For example, when wafer 110 is placed or dropped on the cleaning module chuck (e.g., top side down as shown in FIG. 1E), the heated adhesive (heated by gripper 132) may cause no or low warpage of the wafer which leads to no or low holding or "vacuum" loss at the chuck (see FIG. 1F), and fully automated operation, such as cleaning or removal of the adhesive from the wafer at a cleaning chuck (e.g., see FIG. 1G) can be completed.

In some cases, using gripper 132 to grip, transfer and place wafer 110 includes heating an adhesive layer of the device wafer during gripping, transferring and placing by heating a vacuum gas expelled by the gripper 132 and that comes in contact with the adhesive layer 122 of the wafer.

Figure 3A:
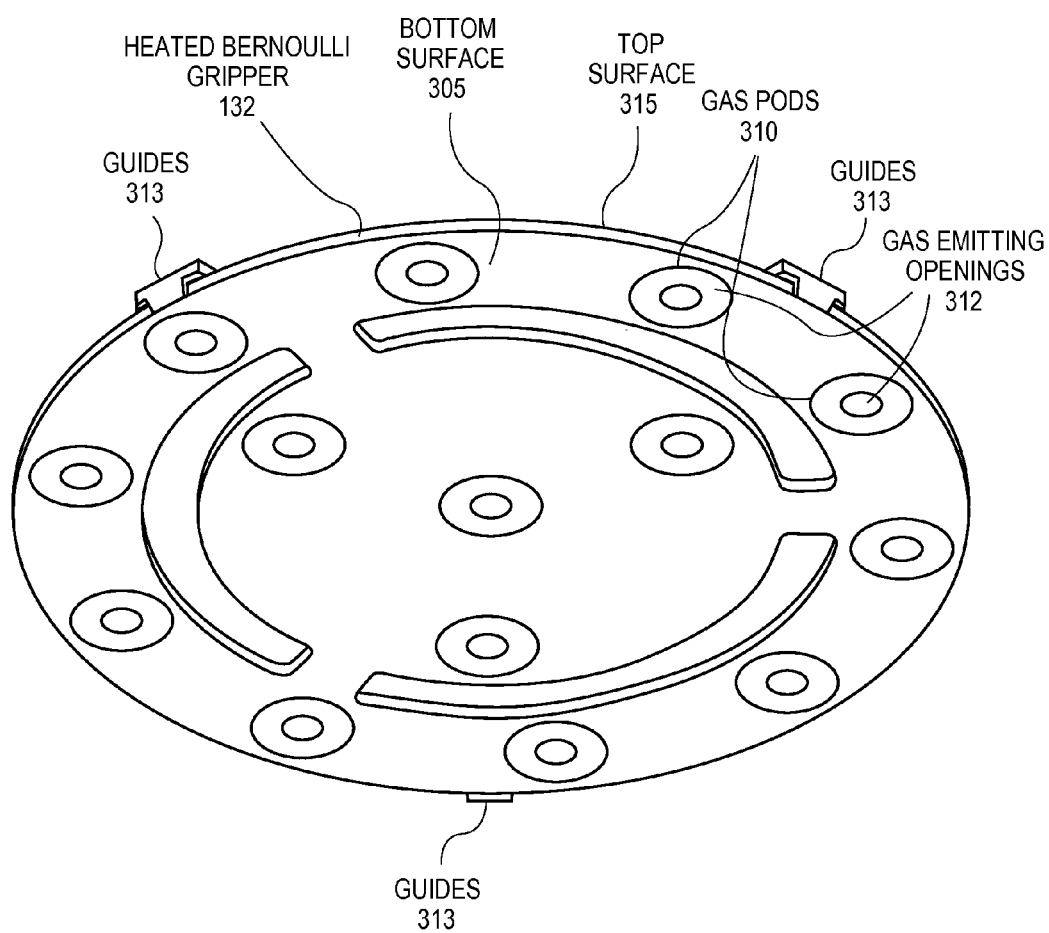
FIG. 3A shows an example of a gripping surface of a heated non-contact wafer handling gripper.
Figure 3B:
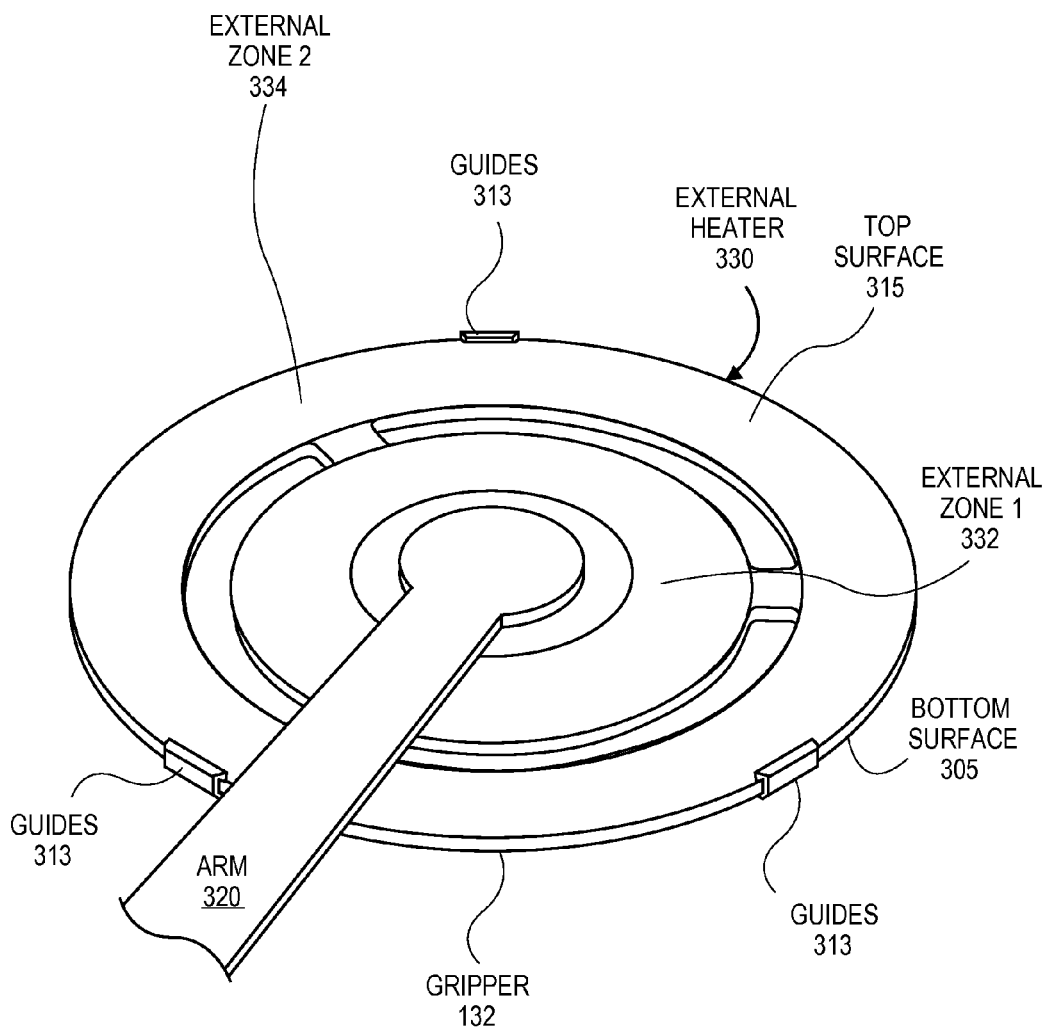
FIG. 3B shows an example of an external heater on a non-gripping surface of a heated non-contact wafer handling gripper.
Figure 3C:
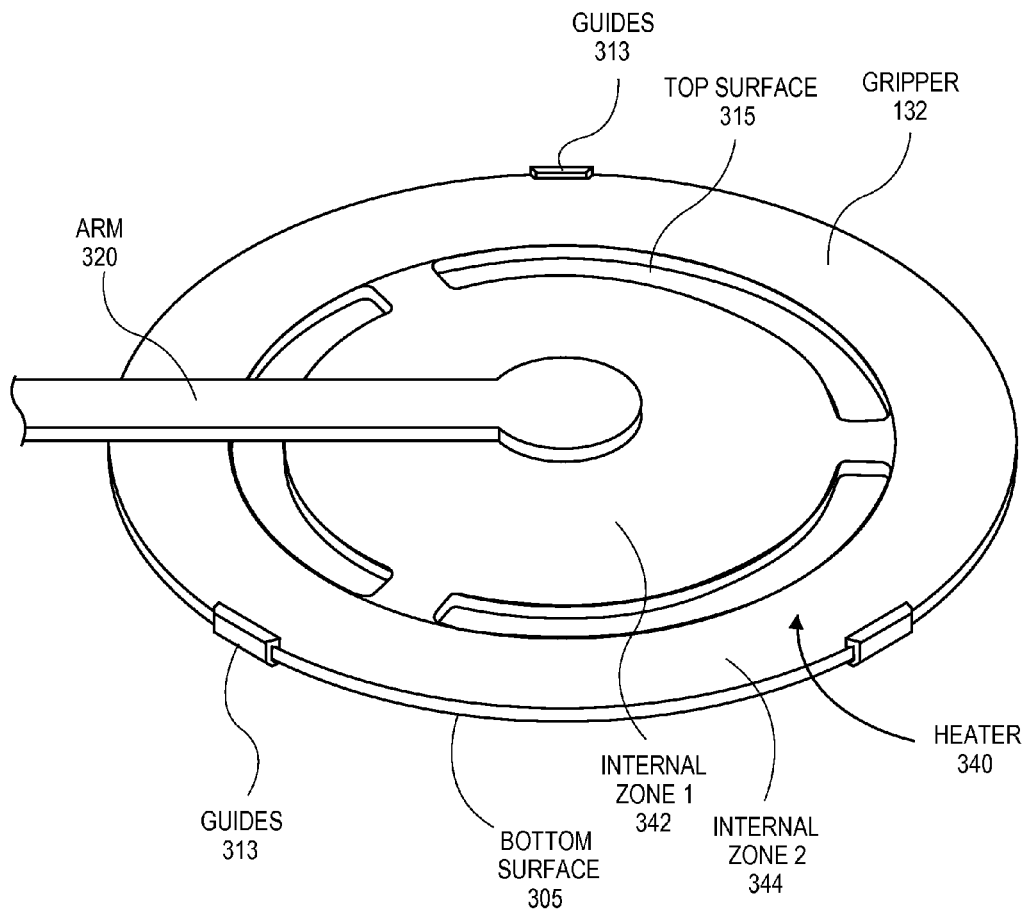
FIG. 3C shows a built in heater within a heated non-contact wafer handling gripper.

In some cases, using gripper 132 to grip, transfer and place wafer 110 includes heating the gripper 132 using heating elements disposed on a top surface or disposed within gripper 131, to heat adhesive 122 by heating the bottom surface of gripper 132 that wafer 110 floats above during gripping, transferring and placing (e.g., see FIGS. 3A-C). The heat from the surface of the gripper is transferred through the small gap between the gripper and surface 117. In some cases, the small gap between the gripper gripping surface and surface 117 is a gap of between 1 and 5 mm (e.g., of gas or air). In some cases, the small gap between the gripper and surface 117 is a gap of between 11 and 3 mm (e.g., of gas or air). In some cases, the vertical distance between the gripper heater or the cleaning chuck heater and the device wafer is between 1 and 5 mm (e.g., including any components of the gripper or the cleaning chuck, and any of gas or air).

In some cases, such heating may include heating the bottom (e.g., gripping) surface of the handler or gripper 132, or heating adhesive 122 (or surface 117) to one of (1) a glass transition temperature (Tg) of the adhesive plus or minus 25 percent of the glass transition temperature (Tg) of the adhesive, (2) a glass transition temperature (Tg) of the adhesive plus or minus 10 percent of the glass transition temperature (Tg) of the adhesive, or (3) between 0.5 and 3 times the Tg of the adhesive. In some cases, the handler or gripper has one or more heating elements, conductors, wires, resistors, and the like to heat gripper 132 or adhesive 122 to one of (1) a glass transition temperature (Tg) of the adhesive plus or minus 25 percent of the glass transition temperature (Tg) of the adhesive, (2) a glass transition temperature (Tg) of the adhesive plus or minus 10 percent of the glass transition temperature (Tg) of the adhesive, or (3) between 0.5 and 3 times the Tg of the adhesive. In some cases, such heating may include heating adhesive 122 (or surface 117 or wafer 110) to between 0.5 and 3 times Tg of adhesive 122 or material adhesive 122 includes. In some cases, this heating of adhesive 122 is to between 0.7 and 2 times Tg of adhesive 122 or material adhesive 122 includes. In some cases, heating the gripper or adhesive to a glass transition temperature (Tg) of the adhesive plus or minus 10 percent of the glass transition temperature (Tg) of the adhesive is more efficient, expends less energy and provide quicker handling, cleaning or processing of wafer 110 than heating to a different temperature.

Figure 1F:
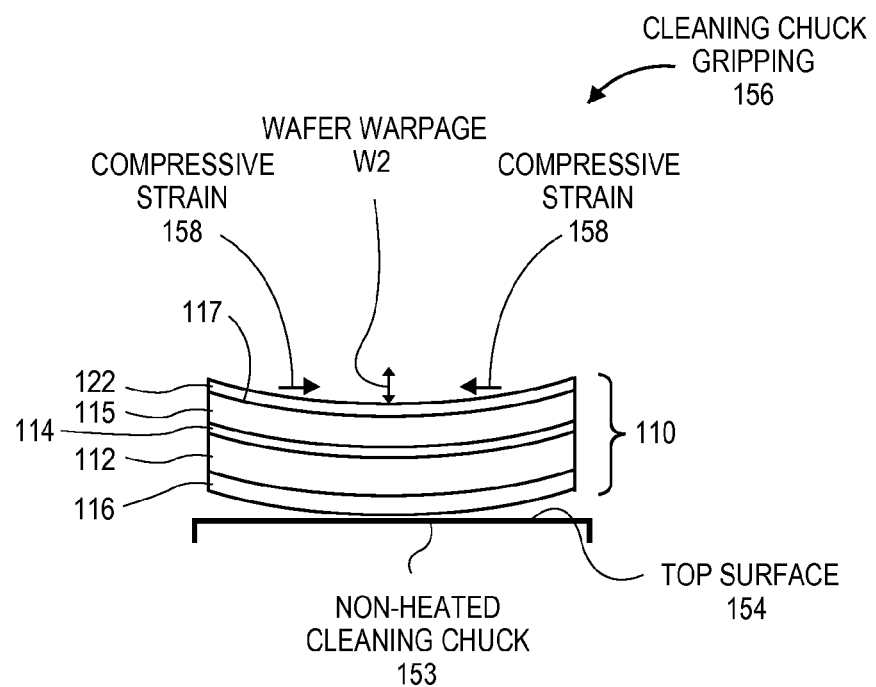
FIG. 1F shows the device wafer of FIG. 1B or 1E after cleaning chuck gripping, and having wafer warpage, such as due to cooling of the adhesive layer during deposition of the wafer upon or while the wafer is on a non-heated cleaning chuck.
Figure 1G:
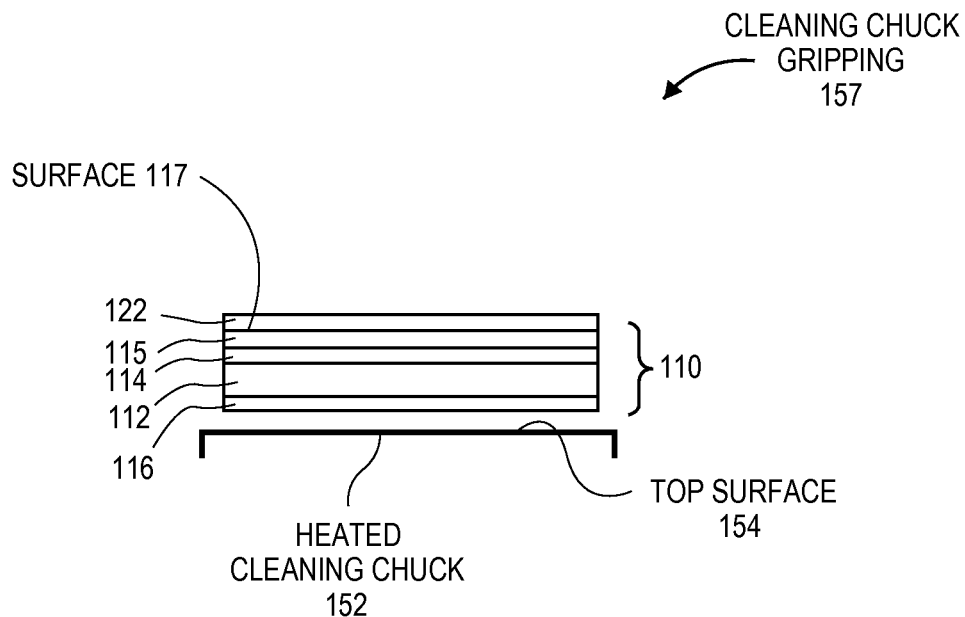
FIG. 1G shows the device wafer of FIG. 1B or 1E after heated cleaning chuck gripping, and having acceptable, reduced or no wafer warpage due to heating of the adhesive during deposition of the wafer upon or while the wafer is on the cleaning chuck.
Figure 1H:
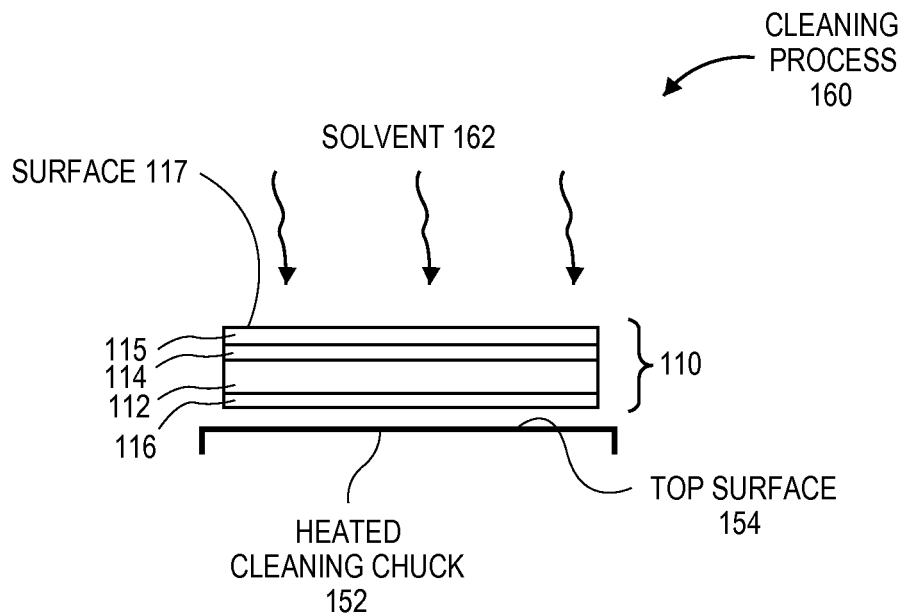
FIG. 1H shows the device wafer of FIG. 1G after cleaning the adhesive off of the bottom surface of the wafer by exposing the adhesive to solvent while the device wafer is on and being heated by the heated cleaning chuck.

In some embodiments, the entire device wafer is heated by the cleaning chuck to lower than the flashpoint of the solvent 162 used to clean adhesive 122 (e.g., see FIG. 1H). In some embodiments, the entire device wafer is heated by gripper 132 or chuck 152 to a temperature and for a period of time that considers other constraints such as grain growth of or in metal layers 115 and/or 116; oxidation of or in metal layers 115 and/or 116; and/or device damage of or in device layers 114.

FIG. 1E shows the device wafer of FIG. 1B, 1C or 1D after placing, cleaning, and vacuum processing of the device wafer on an adhesive cleaning chuck. FIG. 1E shows placing, cleaning, and vacuum processes 150 including device wafer 110 being placed or transferred onto adhesive cleaning chuck 151. Cleaning chuck 151 may represent or be non-heated cleaning chuck 153 (e.g., see FIG. 1F) or heated cleaning chuck 152 (e.g., see FIG. 1G) by gripper 132. Process 150 may include transferring wafer 110 to cleaning chuck 151, where adhesive 122 will be dissolved or cleaned off of wafer 110.

In some cases, FIG. 1E shows process 150 including cleaning chuck 151 gripping or in physical contact with top surface of device wafer 110 for moving or transferring wafer 110 away from, or off of gripper 132, and heated non-contact gripper 132 gripping but not in physical contact with adhesive 122 or with bottom surface 117 of wafer 110. After depositing or dropping wafer 110 onto chuck 151, adhesive 122 may be cleaned or dissolved off of surface 117 (e.g., to have zero thickness of adhesive 122 on surface 117).

Process 150 may include gripping top surface of wafer 110 (while wafer 110 is inverted) by or with cleaning chuck 151 by forming a gripping force such as a vacuum, electrostatic chuck (ESC) attraction, or other appropriate gripping force between the top surface of wafer 110 and top surface 154 of chuck 151 by sucking in air or ambient gas at openings in surface 154 of the chuck facing wafer 110. In some cases, the gripping force includes a force from vacuum channels or a porous surface (e.g., gripping surface) of the chuck, such as created by sucking in air or ambient gas through the vacuum channels or a porous surface. Surface 154 may be heated surface upon which a top surface (layer) of wafer 110 may be deposited and held (e.g. such as by a vacuum force exerted through openings of surface 154). Chuck 118 may grip wafer 110 by forming a gripping force such as a vacuum, electrostatic chuck (ESC) attraction, or other appropriate gripping force between the top surface of wafer 110 and debond carrier chuck 128. In some cases, the gripping force includes a force from vacuum channels or a porous surface (e.g., gripping surface) of the chuck, such as created by sucking in air or ambient gas through the vacuum channels or a porous surface.

Process 150 may include using chuck 151 contacting or attached to a top surface and/or sides of the device wafer 110 while gripper 132 grips surface 117 (and adhesive 122). Process 150 may include releasing or removing wafer 110 from gripper 132 after chuck 151 grips the top surface of wafer 110, such as by pulling gripper 132 up and away from wafer 110 in direction D2, while chuck 151 is held at a vertical fixed location with respect to gripper 132. Process 150 may include releasing or removing gripper 132 from wafer 110 by removing or discontinuing the holding force or "vacuum" between the surface 117 (and adhesive 122) of wafer 110 and gripper 132. Process 150 may include reducing or removing the vacuum (e.g., holding force) formed between the layer of adhesive or between surface 117 using pods of gripper 132 (e.g., pods 310 of FIG. 3A having openings 312) to emit a gas that is lighter than air, such as Nitrogen.

It can be appreciated that in another embodiment, chuck 151 may be moved downwards while gripper 132 is held at a fixed location. In some cases, chuck 151 and wafer gripper 132 are pulled apart by moving the chuck relative to gripper 132 in direction D2 to pull gripper 132 from surface 117 of wafer 110 relative to direction D2.

Process 150 may include placing or depositing metal layer 116 of device wafer 110 onto heated adhesive cleaning chuck 152, wherein placing includes cleaning the device wafer and forming a holding force or "vacuum" between the metal layer 116 of the device wafer using openings in the top surface of cleaning chuck 152 to create or cause that top surface to contact or be attached to a top side of the device wafer comprising the metal.

FIG. 1F shows the device wafer of FIG. 1B or 1E after cleaning chuck gripping, and having wafer warpage, such as due to cooling of the adhesive layer during deposition of the wafer upon or while the wafer is on a non-heated cleaning chuck. FIG. 1F may show wafer 110 having wafer warpage W2 between edges of wafer 110 and a center of wafer 110, after non-heated cleaning chuck 153 gripping process 156 of the wafer, such as due to cooling of the residue thickness T2 of adhesive 122 during transfer by the gripper and/or while on the cleaning chuck. In some cases, warpage W2 is due only to cooling of the residue thickness T2 of adhesive 122 (e.g., is not due to thermal differences between layers 115 and 116, or other factors). Cleaning chuck gripping 156 of the wafer may include depositing or dropping wafer 110 after inverting the wafer and transferring (or transferring and inverting) the wafer to the adhesive cleaning chuck 151, such as described for FIG. 1E. In some cases, FIG. 1F shows device wafer 110 having compressive strain 158 causing wafer warpage W2 between the center of surface 117 of wafer 110 and edges of wafer 110.

According to embodiments, cooling of the adhesive layer may be due to gas emitted from pods 310 at room temperature (e.g., FIG. 1C) and/or the temperature of chuck 153, which may be cooler than Tg of the adhesive or may be room temperature. For thin wafers (e.g., less than or equal to 122 um—micro meters), this may result in increased shrinkage (e.g., compression) of the adhesive and bonding of the adhesive to the bottom surface of the device wafer (now inverted or upside down and on top of the wafer).

For example gripper 132 transfer or deposition of wafer 110; or gripping 156 of wafer 110 on chuck 153, may cause warpage W2 due to cooling, solidification, cool down, firming up to a non liquid, shrinkage, compressive strain, and/or adhering of adhesive 122 to bottom surface 117 of device wafer. For example, for embodiments of chuck 153 that are not a heated chuck, or that do not have the heating elements of chuck 152 activated or turned on, adhesive 122 may cool and/or dry, causing it to shrink and adhere to surface 117 of wafer 110. This shrinking and adhering may cause compressive strain 158 across the top surface of wafer 110, causing the wafer to warp inwards with wafer warpage W2 on the side that the adhesive is on. In this case, the adhesive may cool to room temperature, a temperature below Tg, or below another temperature, which the heated gripper or cleaning chuck is described as heating the adhesive to. When cooled, the repeating units of material of the adhesive may remain stationary in tighter patterns at that temperature, thus gripping surface 117 of the disk and pulling it with compressive force 158 which may or may not cause warpage W2. In some cases, warpage W2 does not occur during the holding or "vacuum" force of gripper 132 and surface 117, but warpage does occur once wafer 110 is deposited or dropped onto another surface, such as onto cleaning chuck 153. Thus, although chuck 153 may attempt to or use a holding or "vacuum" force to grip or hold wafer 110, compressive force 158 may cause wafer 110 to warp, before or with sufficient force, such that a holding or "vacuum" force of chuck 153 is not sufficient to hold or flatten out wafer 110.

In some cases, FIG. 1F shows highly warped wafer in Debond-Cleaning chuck showing inability to achieve sufficient holding force or "vacuum" to hold the wafer pre-clean. For example, when wafer 110 is placed or dropped on the cleaning module chuck (e.g., top side down as shown in FIG. 1E), the cooled adhesive may cause high warpage of the wafer which leads to holding force or "vacuum" loss at surface 154 of chuck 153, and fully-automated operation, such as cleaning or removal of the adhesive from the wafer at a cleaning chuck (e.g., see FIG. 1H) cannot be completed.

Warpage W2 may be caused by cooling of adhesive 122, and have results, problems or effects similar to those described above for warpage W1.

As noted above, to reduce, avoid or eliminate such warpage and associated problems (e.g., so the wafer is not being impacted by such warpage), some embodiments of the invention use a heated adhesive cleaning chuck to clean bonding adhesive from thin device wafers without wafer warpage after debonding (e.g., see FIG. 1G-1H). These embodiments may be combined with gripper 132 to reduce wafer warpage due to wafer temporary adhesive induced warpage by controlling such warpage (e.g., by controlling cooling after debonding).

FIG. 1G shows the device wafer of FIG. 1B or 1E after heated cleaning chuck gripping, and having acceptable, reduced or no wafer warpage due to heating of the adhesive during deposition of the wafer upon or while the wafer is on the cleaning chuck. FIG. 1G may show wafer 110 having acceptable, reduced or no wafer warpage between edges of wafer 110 and a center of wafer 110, after heated cleaning chuck 152 heating of the wafer during cleaning chuck gripping process 157. This heating avoids cooling of the residue thickness T2 of adhesive 122 during transfer by the gripper and/or while on the cleaning chuck. Cleaning chuck gripping 157 of the wafer may include depositing or dropping wafer 110 after inverting the wafer and transferring (or transferring and inverting) the wafer to the adhesive cleaning chuck, such as described for FIG. 1E. In some cases, FIG. 1G shows device wafer 110 having acceptable, reduced or no wafer compressive strain causing acceptable, reduced or no wafer warpage.

According to embodiments, as noted below, heated cleaning chuck 152 grips or holds wafer 110 while being heated sufficiently to reduce, avoid or eliminate such warpage and associated problems. For example, surface 154 may be heated surface upon which a top surface (layer) of wafer 110 may be deposited and held (e.g. such as by a holding or "vacuum" force exerted through openings of surface 154). In some cases, during or after process 157, wafer 110 has warpage that is reduced, has no warpage, is eliminated, or is acceptable for forming a holding force or "vacuum" on chuck 152. In some cases, during or after process 157, wafer 110 has "acceptable" warpage such as warpage less than warpage W2 between the center of wafer 110 and surface 154, such as warpage that is acceptable for gripping by chuck 156 during cleaning of the adhesive.

According to embodiments, due to heating of wafer 110 by chuck 152, when the gas is emitted from pods 310 at room temperature, that gas does not cool the device wafer during deposition of the wafer onto the cleaning chuck. Thus, for thin wafers (e.g., less than or equal to 122 um—micro meters), this emission does not result in increased shrinkage (e.g., compression) of the adhesive and bonding of the adhesive to the bottom surface of the device wafer, because the adhesive does not cool or dry sufficiently for such shrinkage and bonding.

Notably, gripper 132 transfer of wafer 110 to heated chuck 152 may not cause warpage W2 due to cooling, solidification, cool down, firming up to a non liquid, shrinkage, compressive strain, and/or adhering of adhesive 122 to bottom surface 117 of device wafer. For example, for embodiments of heated chuck 152 (e.g., and that have the heating elements of the chuck activated or turned on) adhesive 122 may be heated or maintained at a temperature (e.g., not cooled and/or dried) that does cause it to not shrink and adhere to surface 117 of wafer 110. This avoids shrinking and adhering that may cause compressive strain 158 across the top surface of wafer 110, and avoids causing the wafer to warp inwards with wafer warpage W2. Such heating may be heating to greater than room temperature, a percentage of Tg, or another temperature which the heated gripper or cleaning chuck is described as heating the adhesive to. Such heating may cause repeating units of material of the adhesive to move about randomly, such as in a fluid, thus not gripping surface 117 of the disk and pulling it with compressive force 158, and thus not causing warpage W2, but instead causing reduced, no or acceptable warpage. In some cases, warpage W2 does not occur during the holding or vacuum force of gripper 132 and surface 117, and does occur once wafer 110 is deposited or dropped onto cleaning chuck 152. Thus, chuck 152 may successfully attempt to or use a holding or vacuum force to grip or hold wafer 110, since compressive force 158 does not cause wafer 110 to warp a sufficient amount or with sufficient force that prohibits a holding or vacuum force of chuck 152 from holding or flattening out wafer 110.

For example, when wafer 110 is placed or dropped on the cleaning module chuck (e.g., top side down as shown in FIG. 1E), the heated adhesive (heated by chuck 152) may cause no or low warpage of the wafer which leads to no or low holding or vacuum loss at the chuck, and fully-automated operation, such as cleaning or removal of the adhesive from the wafer at a cleaning chuck (e.g., see FIG. 1H) can be completed.

In some cases, using chuck 152 to grip or hold wafer 110 includes heating the wafer during gripping or holding using heating elements disposed on a bottom surface or disposed within chuck 152, to heat wafer 110 (e.g., adhesive 122) by heating the top surface 154 of chuck 152 that wafer 110 is held by during gripping or holding. The heat from the surface 154 of chuck 152 is transferred by contact between chuck 152 and the top (e.g., metal) surface of wafer 110.

In some cases, such heating may include heating the top (e.g., gripping) surface 154 of chuck 152, or heating adhesive 122 (or surface 117) to one of (1) a glass transition temperature (Tg) of the adhesive plus or minus 25 percent of the glass transition temperature (Tg) of the adhesive, (2) a glass transition temperature (Tg) of the adhesive plus or minus 10 percent of the glass transition temperature (Tg) of the adhesive, or (3) between 0.5 and 3 times the Tg of the adhesive. In some cases, chuck 152 has one or more heating elements, conductors, wires, resistors, and the like to heat chuck 152 or adhesive 122 to one of (1) a glass transition temperature (Tg) of the adhesive plus or minus 25 percent of the glass transition temperature (Tg) of the adhesive, (2) a glass transition temperature (Tg) of the adhesive plus or minus 10 percent of the glass transition temperature (Tg) of the adhesive, or (3) between 0.5 and 3 times the Tg of the adhesive. In some cases, such heating may include heating adhesive 122 (or surface 117 or wafer 110) to between 0.5 and 3 times Tg of adhesive 122 or material adhesive 122 includes. In some cases, this heating of adhesive 122 is to between 0.7 and 2 times Tg of adhesive 122 or material adhesive 122 includes. In some cases, heating the chuck or adhesive to a glass transition temperature (Tg) of the adhesive plus or minus 10 percent of the glass transition temperature (Tg) of the adhesive is more efficient, expends less energy and provide quicker handling, cleaning or processing of wafer 110 than heating to a different temperature.

In some embodiments, the entire device wafer is heated by the cleaning chuck to lower than the flashpoint of the solvent used to clean adhesive 122 (e.g., see FIG. 1H). In some embodiments, the entire device wafer is heated by the cleaning chuck to a temperature and for a period of time that does not over oxidize the copper or decompose the copper (e.g., of layer 116) due to the amount of heat and time of exposure to oxygen while the wafer is heated.

FIG. 1H shows the device wafer of FIG. 1G after cleaning the adhesive off of the bottom surface of the wafer by exposing the adhesive to solvent while the device wafer is on and being heated by the heated cleaning chuck. FIG. 1H shows wafer 110 during or after cleaning process 160 for cleaning the adhesive 122 off of the bottom surface 117 of the wafer by exposing the adhesive to solvent 162 while the device wafer is held by or on the heated cleaning chuck 152 and is being heated by surface 154. Process 160 may include exposing adhesive 122 to or washing adhesive 122 with solvent 162 to dissolve or clean all of adhesive 122 from surface 117 of wafer 110, while wafer 110 is held by or on adhesive cleaning chuck 152. After process 160, surface 117 may be exposed to the ambient as all of adhesive 122 has been removed. Consequently, After process 160, wafer 110 (and chuck 152) can be cooled or do not required heating since the adhesive has been removed and thus, so has the risk of the compressive force and warping of the wafer due to existence of adhesive 122.

Process 160 may include cleaning the adhesive off of the bottom surface of the wafer by exposing the adhesive and/or bottom surface to a solvent 162, wherein cleaning includes holding layer of metal 116 or a top surface of wafer 110 with the heated adhesive cleaning chuck 152 by forming a holding force or vacuum between the device wafer (e.g., layer 116 and the cleaning chuck.

After cleaning the adhesive off of the bottom surface of the wafer, wafer 110 may be cooled or removed from chuck 152 using a non-heated or room temperature handler, gripper or other device. This may include forming a holding force or vacuum between surface 117 (e.g., the substrate) of the device wafer and the non-heated or room temperature handler, gripper or other device.

According to some embodiments some of FIGS. 1A-1H are not performed. According to some embodiments some of FIGS. 1C and 1F are not performed. According to some embodiments only FIGS. 1B, 1D and 1G are performed. According to some embodiments only FIG. 1B or 1D, and 1G are performed.

Thus, embodiments provide devices and processes to use a heated non-contact wafer handling gripper to reduce wafer warpage post debond, thus enabling debonding of thin wafers (e.g., which may include wafer 110 described herein) that may otherwise be highly warped wafers. Currently no solution exist to reduce room temperature wafer warpage post debond for certain designs of thin wafers (e.g., having a thickness of 122 um or less). Instead these wafers exhibit greater than 35 mm wafer warpage W1. This risk and warpage is expected to be worsen as wafer thickness is decreased.

Such thin wafers may include wafer 110 described herein, which may be a full loop processed wafer having a tm1-metal layer with standard thickness and one or more layers of metal (e.g., which may include wafer 110 described herein). Such a wafer may include through silicon vias (TSV). Such a wafer may include logic or memory TSV wafers. In some cases, the wafer may be used to stack a logic upon a logic pair of wafers; or to stack a memory upon a logic pair of wafers. Such a wafer may include CPUs, chipsets, graphics chips, or other high density logic device that want to implement 3D stacking (TSV).

Some thin wafers (e.g., semiconductor or silicon wafers having a diameter of between 50 and 450 mm; and a thickness T10 of 122 um or less) exhibit above than 35 mm warpage (e.g., warpage W1) which could be greater than 90 mm warpage post debond before solvent cleaning (and/or warpage W2). At these high warpage values (warpage above 35 mm) the wafers fail to achieve sufficient holding force or vacuum at the solvent cleaning module (e.g., at the top surface of the cleaning chuck), and could not proceed with the cleaning process.

The high warpage thin wafers also leave adhesive residue on the gripper or chuck (e.g., on the edge restrains). The built-up of adhesive residue makes the wafer stick to the gripper or chuck (e.g., to the surface, pods, and/or guides), such that it may not be released onto the cleaning chuck in full auto operation. The challenge to handle highly warped thin wafers may be a key technical risk to enable TSV (e.g., through silicon vias) die preparation.

Use of a heated gripper and/or cleaning chuck as described herein provide acceptable wafer warpage for wafer handling post debond, thus enabling the thermal slide debond technology using thermoplastic adhesives.

Use of a heated gripper and/or cleaning chuck as described herein eliminates the need for more complex carrier preparation and the use of mounting on Dicing Tape before debond and slower debond throughput. The proposed use herein can enable thin wafer handling using less complex thermoplastic adhesives, high debond throughput and lower adhesive cost. It is also noted that using heated chuck 152 to heat adhesive 122 allows the adhesive to be removed more quickly by the solvent because the heated adhesive is more susceptible to the solvent. For example, the heated solvent is in or closer to a liquid state (e.g., nearer Tg) than a non heated or room temperature solvent. Thus it may dissolve more quickly when exposed to or showered with the solvent.

Figure 2:
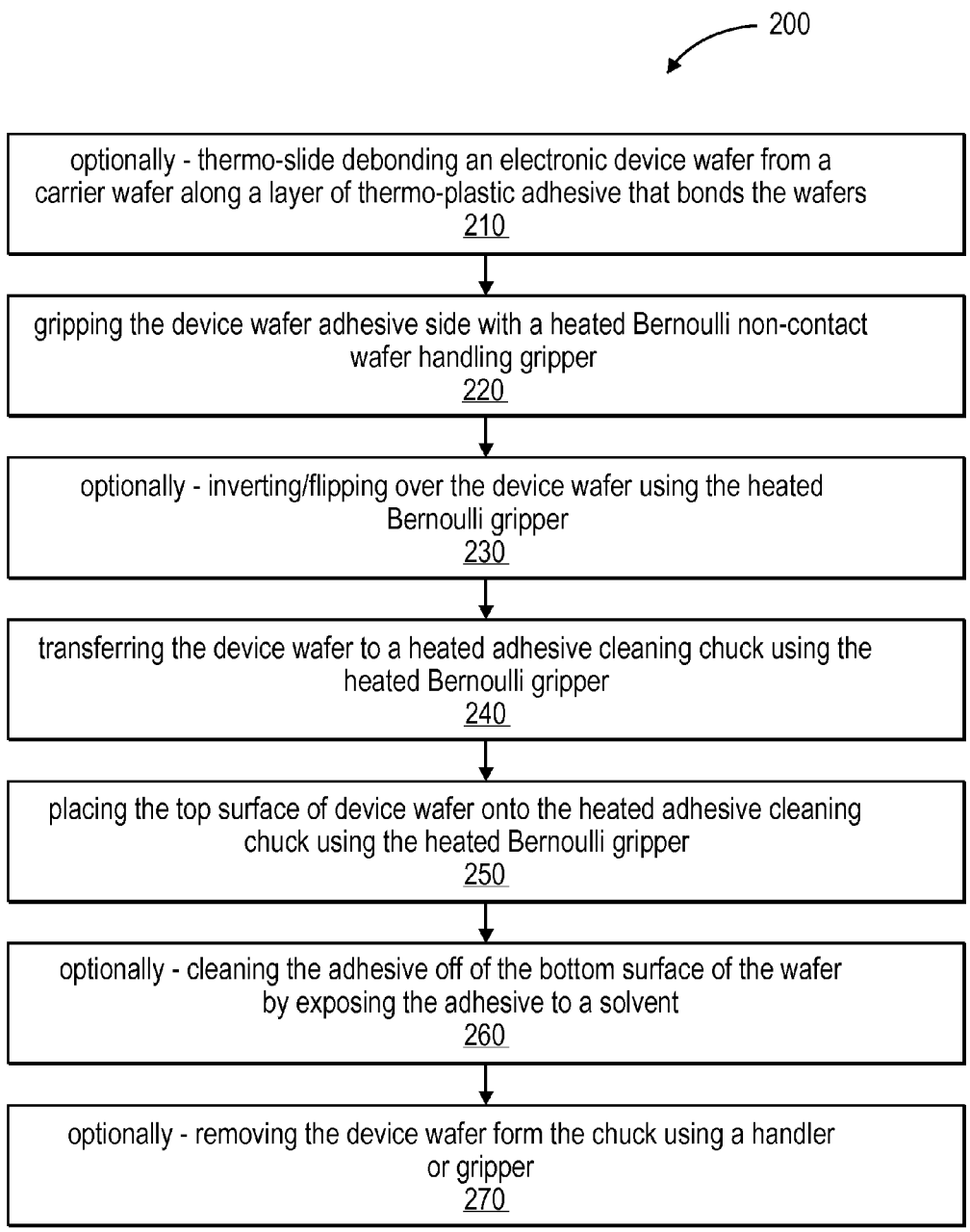
FIG. 2 is an example process for gripping an electronic device wafer with a heated gripper, and transferring the device wafer to a heated adhesive cleaning chuck.

FIG. 2 is an example process for gripping an electronic device wafer with a heated gripper, and transferring the device wafer to a heated adhesive cleaning chuck. FIG. 2 shows process 200 beginning with block 210 where, in some optional cases, a process occurs for debonding an electronic device wafer from a carrier along a layer of temporary bonding adhesive that bonds the wafers. Block 210 may include descriptions above for FIG. 1A or process 100.

Next, at block 220, a process occurs for gripping the device wafer adhesive side with a heated non-contact wafer handling gripper. Block 220 may include descriptions above for FIG. 1B or process 130.

Next, at block 230, in some optional cases, a process occurs for inverting or flipping over the device wafer using the heated gripper. Block 230 may include descriptions above for FIG. 1D or process 141.

Next, at block 240, a process occurs for transferring the device wafer to a heated adhesive cleaning chuck using the heated gripper. Block 240 may include descriptions above for FIG. 1B, FIG. 1D, process 130 or process 141.

Next, at block 250, a process occurs for placing the top surface of device wafer onto the heated adhesive cleaning chuck using the heated gripper. Block 250 may include descriptions above for FIG. 1E, FIG. 1G, process 150 or process 157.

Next, at block 260, in some optional cases, a process occurs for cleaning the adhesive off of the bottom surface of the wafer by exposing the adhesive to a solvent. Block 260 may include descriptions above for FIG. 1H or process 160. Once the adhesive is removed, the wafer may be cooled or heating may be discontinued.

Next, at block 270, in some optional cases, a process occurs for removing the device wafer form the chuck using a handler or gripper. Block 270 may include descriptions above for FIG. 1H or process 160.

According to embodiments, process 200 only includes blocks 220 and 250. According to embodiments, process 200 only includes blocks 220, 240 and 250. According to embodiments, process 200 only includes blocks 220, 240 and 250, and any one or two of the optional blocks. According to embodiments, process 200 only includes blocks 220, 240 and 250, and any three or four of the optional blocks.

FIG. 3A shows an example of a gripping surface of a heated non-contact wafer handling gripper. FIG. 3A shows gripping or bottom surface 305 of gripper 132 having gas pods 310 with gas emitting openings 312 to emit, expel or discharge a gas that is lighter than air, such as Nitrogen, helium or hydrogen, with pressure, such as for forming a vacuum (e.g., holding force) or low pressure regions (at the pods) between a wafer surface and the pods that is sufficient to holding, grip, invert, flip, transfer, move or otherwise handle the wafer (e.g., see Figured 1B-1G). Top surface 315 is shown and is opposite surface 305. The gripper may have circuitry, electronics, ducting, sensors, gas passages and other components as known for such a gripper. Some of these may be between the top and bottom surfaces. In some cases, there may be between 3 and 70 gas pods. In some cases, there may be between 1 and 50 gas emitting openings per pod. Gripper also includes guides 313 on the gripper or chuck edge, such as for centering the wafer on the surface of the gripper 132 by maintaining the wafer at a fixed location with respect to a lateral direction (e.g., direction D1) or position with respect to the gripper.

FIG. 3B shows an example of an external heater on a non-gripping surface of a heated non-contact wafer handling gripper. FIG. 3B shows an embodiment of gripper 132 having an external heater or external heating apparatus, such as a heater mounted on a top surface gripper to heat an adhesive layer of the wafer. This may include heating the bottom side and/or all of the device wafer. FIG. 3B shows an embodiment of gripper 132 having guides 313, top surface 315, bottom surface 305, arm 320, and heater 330.

Heater 330 may be disposed on or mounted on top surface 315. In some cases, heater 330 is disposed on or mounted on bottom surface 305. In some cases, heater 330 is disposed on or mounted on bottom surface 305, and is disposed in a pattern between pods 310 (e.g., as external heating resistors). In some cases, heater 330 is disposed on or mounted on bottom surface 305, and disposed on or mounted on pods 310 (e.g., as external heating resistors). It can be appreciated that various other appropriate external heater configurations and patterns can be used to provide heated gripper 132 as described herein.

Heater 330 may include zone 1 of heaters—332; and zone 2 of heaters—334. Zone 1 may be or include disc heating elements, resistors, or wires disposed above or mounted upon surface 315; and disposed between (e.g., and having) a first inner and outer radius. Zone 2 may be or include disc heating elements, resistors, or wires disposed above or mounted upon surface 315; and disposed between (e.g., and having) a second inner and outer radius. The inner radius of zone 2 may be greater than the outer radius of zone 1, and the outer radius of zone 2 may be less than or equal to the radius of gripper 130.

Gripper 132 may be mounted on arm 320. Arm 320 may be used to move, invert, transfer, or otherwise manipulate gripper 132, so that gripper 132 may "handle" wafer 110 as described herein (e.g. as described for FIGS. 1A-1D).

Heater 330 and/or heaters 332 and 334 may be connected to an electrical source through wiring extending along or within arm 320. It can be appreciated that other types of heaters may be used at the locations of heaters 332 and 334, such as liquid based heaters, friction based heaters, chemical based heaters, ultrasonic based heaters, photonic or light based heaters (e.g., heat lamps). Also, other shapes are considered for heaters 332 and 334 such as square, rectangular, other patterns of heaters; a single heater that covers most of the area of surface 315 or 305 of gripper 132, or more than two heaters that covers most of the area of surface 315 or 305 of gripper 132.

In some cases, gripper (e.g., the handler or chuck of the gripper) may be made of a ceramic, metal, alloy, polymer, or one of those materials with vacuum channels disposed therein. Heater 330 and/or heaters 332 and 334 may be made of a heater tape, or a tape containing heating elements, and may be mounted on the handler or chuck. In one case the heater is two or more concentric rings of heat elements in circular tape heaters applied to the top side 315 of the handler, opposite side 305 that holds the wafer.

FIG. 3C shows a built in heater within a heated non-contact wafer handling gripper. FIG. 3C shows an embodiment of gripper 132 having an internal heater or heating apparatus, such as a heater built into the gripper to heat the bottom side and adhesive layer of the wafer. FIG. 3C shows gripper 132 having guides 313, top surface 315, bottom surface 305, arm 320, and heater 340. Heater 340 may be an internal heater, such as a heater having heating elements, resistors, or wires within or disposed between top surface 315 and bottom surface 305 of gripper 132.

In some cases, heater 340 is disposed above or mounted on a surface opposed to bottom surface 305, and is disposed in a pattern between pods 310 (e.g., as internal heating resistors). In some cases, heater 340 is disposed above or mounted on a surface opposed to bottom surface 305, and disposed on or mounted on the top or inside of pods 310 (e.g., as internal heating resistors). It can be appreciated that various other appropriate internal heater configurations and patterns can be used to provide heated gripper 132 as described herein.

Heater 330 may include zone 1 of internal heaters—342; and zone 2 of internal heaters—344. Zone 1 may be or include disc heating elements, resistors, or wires disposed between top surface 315 and bottom surface 305; and disposed between (e.g., and having) a first inner and outer radius. Zone 2 may be or include disc heating elements, resistors, or wires disposed between top surface 315 and bottom surface 305; and disposed between (e.g., and having) a second inner and outer radius. The inner radius of zone 2 may be greater than the outer radius of zone 1, and the outer radius of zone 2 may be less than or equal to the radius of gripper 130.

In some cases, heater 330 may be a heater that heats the device wafer during gripping, transferring and placing by heating a vacuum gas expelled by the gripper and that comes in contact with the bottom surface of the device wafer, such as to apply a holding force to the wafer while heating the adhesive.

Arm 320 of FIG. 3C may perform functions similar to arm 320 of FIG. 3B. This gripper may have circuitry, electronics, ducting, sensors, gas passages and other components as known for such a gripper. Some of these may be between the top and bottom surfaces.

In some cases, heater 340 and/or heaters 342 and 344 may be made of a tape having heating elements, and mounted or assembled within the handler or chuck of the gripper. In one case the heater is two or more concentric rings of heat elements in circular tape heaters applied inside or between the top side 315 of the handler and side 305 that holds the wafer.

Heater 340 and/or heaters 342 and 344 may be connected to an electrical source, may be other types of heaters, and/or may have other shapes, such as described above for heater 330 and/or heaters 332 and 334.

Figure 4A:
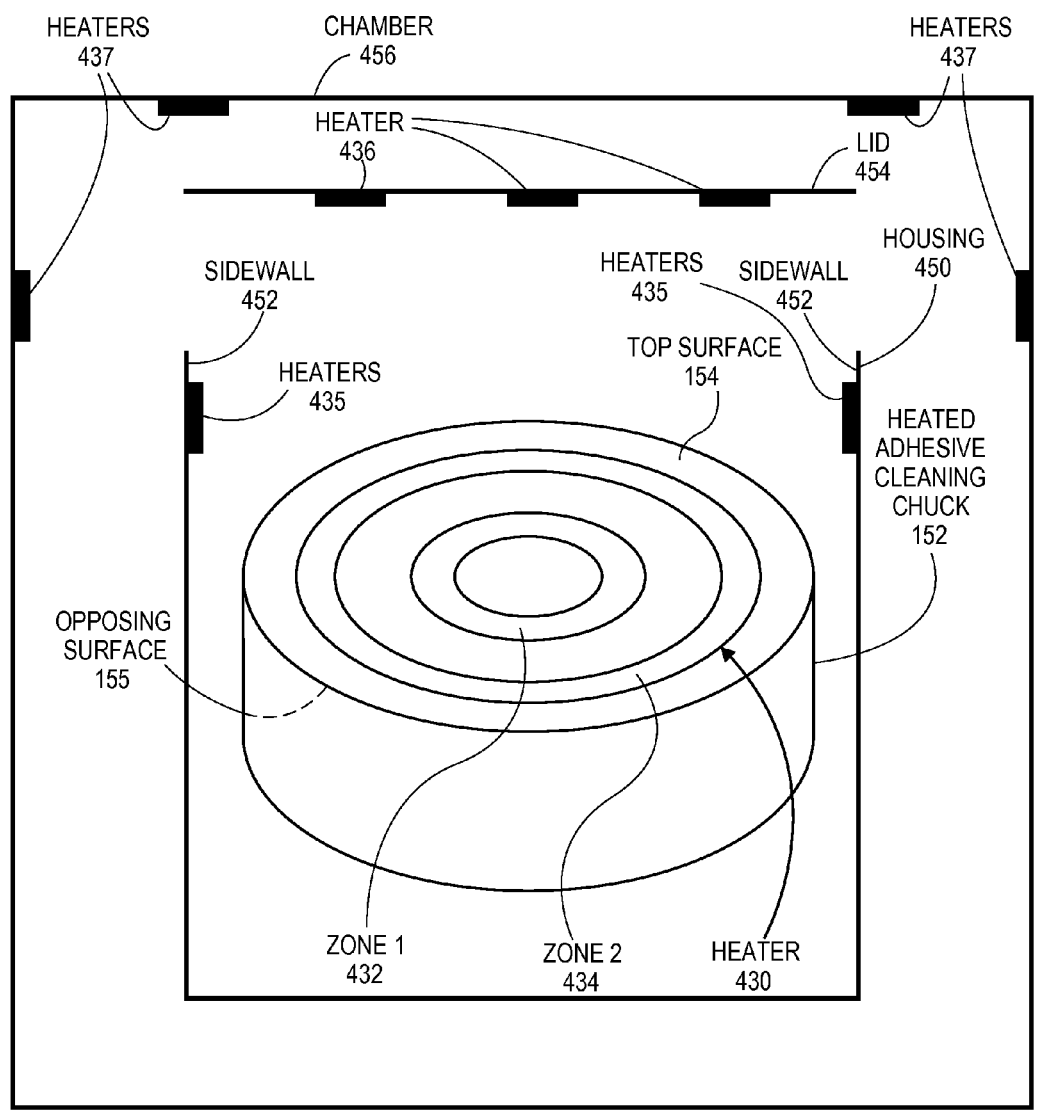
FIG. 4A shows a heated adhesive cleaning chuck.

FIG. 4A shows a heated adhesive cleaning chuck. FIG. 4A shows heated adhesive cleaning chuck 152 having top surface 154, opposing surface 155, and heater 430. Opposing surface 155 may be a surface on the opposite side of the chuck, or wafer holding surface (e.g., having vacuum openings) that has top surface 154. Top surface 154 is shown and is opposite opposing surface 155. The chuck may have circuitry, electronics, ducting, sensors, gas passages and other components as known for such a chuck. Some of these may be below top surface 154 or surface 155.

Heater 430 may be an internal heater, such as a heater having heating elements, resistors, or wires within or disposed below top surface 154, such as mounted on, located at or disposed on opposing surface 155. Heater 340 may be gas or liquid sealed within chuck 152. In some cases, heater 430 is an external heater disposed above or mounted on surface 154, and is disposed in one of various patterns (e.g., as external heating resistors). It can be appreciated that various other appropriate internal and external heater configurations and patterns can be used to provide heated chuck 152 as described herein.

Heater 430 may include zone 1 of internal heaters—432; and zone 2 of internal heaters—434. Zone 1 may be or include disc heating elements, resistors, or wires disposed below top surface 154, such as attached to, contacting or in thermal contact with surface 155; and disposed between (e.g., and having) a first inner and outer radius. Zone 2 may be or include disc heating elements, resistors, or wires disposed below top surface 154, such as attached to, contacting or in thermal contact with surface 155; and disposed between (e.g., and having) a second inner and outer radius. The inner radius of zone 2 may be greater than the outer radius of zone 1, and the outer radius of zone 2 may be less than or equal to the radius of chuck 152.

In some cases, heater 430 may be a heater that heats the device wafer during gripping, transferring and placing by heating a gas expelled by the gripper and that comes in contact with the bottom surface of the device wafer to heat the adhesive.

Heater 430 and/or heaters 432 and 434 may be connected to an electrical source through wiring extending along or within chuck 152. It can be appreciated that other types of heaters may be used at the locations of heaters 432 and 434, such as liquid based heaters, friction based heaters, chemical based heaters, ultrasonic based heaters, photonic or light based heaters (e.g., heat lamps). Also, other shapes are considered for heaters 432 and 434 such as square, rectangular, oval, other patterns of heaters; a single heater that covers most of the area of surface 154 or surface 155, or more than two heaters that covers most of the area of surface 154 or 155.

In some cases, the chuck may be made of a metal, alloy, or porous material or one of those with vacuum channels disposed therein. Heater 430 and/or heaters 432 and 434 may be made of a heater tape, or a tape shaped heating elements, and may be mounted on or below surface 155. In one case the heater is two or more concentric rings of heat elements in circular tape heaters applied to or mounted on surface 155 or disposed within chuck 152 below surface 154 that holds the wafer. In some cases, heater 430 may be a heater in contact with surface 154 or 155 and heat adhesive 122 using thermal conduction.

In some cases, chuck 152 may be mounted or disposed within housing 450. In this case, heaters 430 may only be, or may include (e.g., in addition to the embodiments above) heaters (e.g., represented by heaters 435) mounted on or along sidewalls 452 of housing 450. Also, in this case, heaters 430 may only be, or may include (e.g., in addition to the embodiments above) heaters (e.g., represented by heaters 436) mounted on or along lid 454 of housing 450.

In some cases, housing 450 may be mounted or disposed within chamber 456 (such as a processing or vacuum sealed chamber). In this case, heaters 430 may only be, or may include (e.g., in addition to the embodiments above) heaters (e.g., represented by heaters 437) mounted on or along the top surface or sidewalls 452 of chamber 456. Heaters 435, 436 and 437 may be light source heaters, non-contact heaters, proximity heaters, and/or heaters that heat adhesive 122 using heating convection or heat radiation.

Figure 4B:
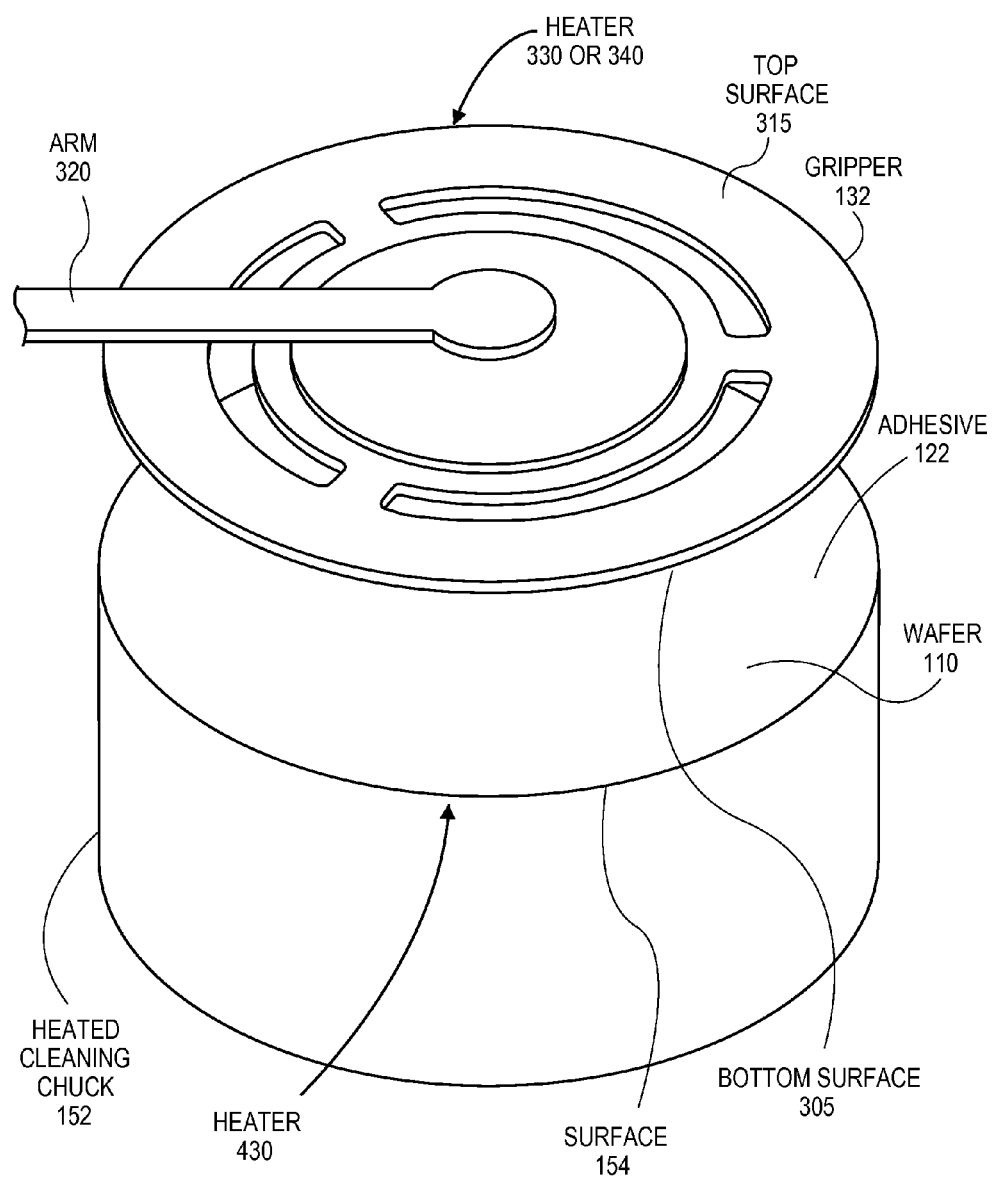
FIG. 4B shows a heated gripper depositing or dropping a device wafer onto a top or vacuum surface of a heated cleaning chuck.

FIG. 4B shows a heated gripper depositing or dropping a device wafer onto a top or vacuum surface of a heated cleaning chuck. FIG. 4B shows gripper 132 depositing or dropping wafer 110 onto surface 154 of heated cleaning chuck 152 (see also FIG. 1D). Chuck 152 is shown having top surface 154. Surface 154 may be heated surface upon which a top surface (layer) of wafer 110 may be deposited and held (e.g. such as by a holding or vacuum force exerted through openings of surface 154). FIG. 4B may include descriptions for FIG. 1D, FIG. 1E, and/or FIG. 1G; and block 240 and/or 250.

Figure 5:
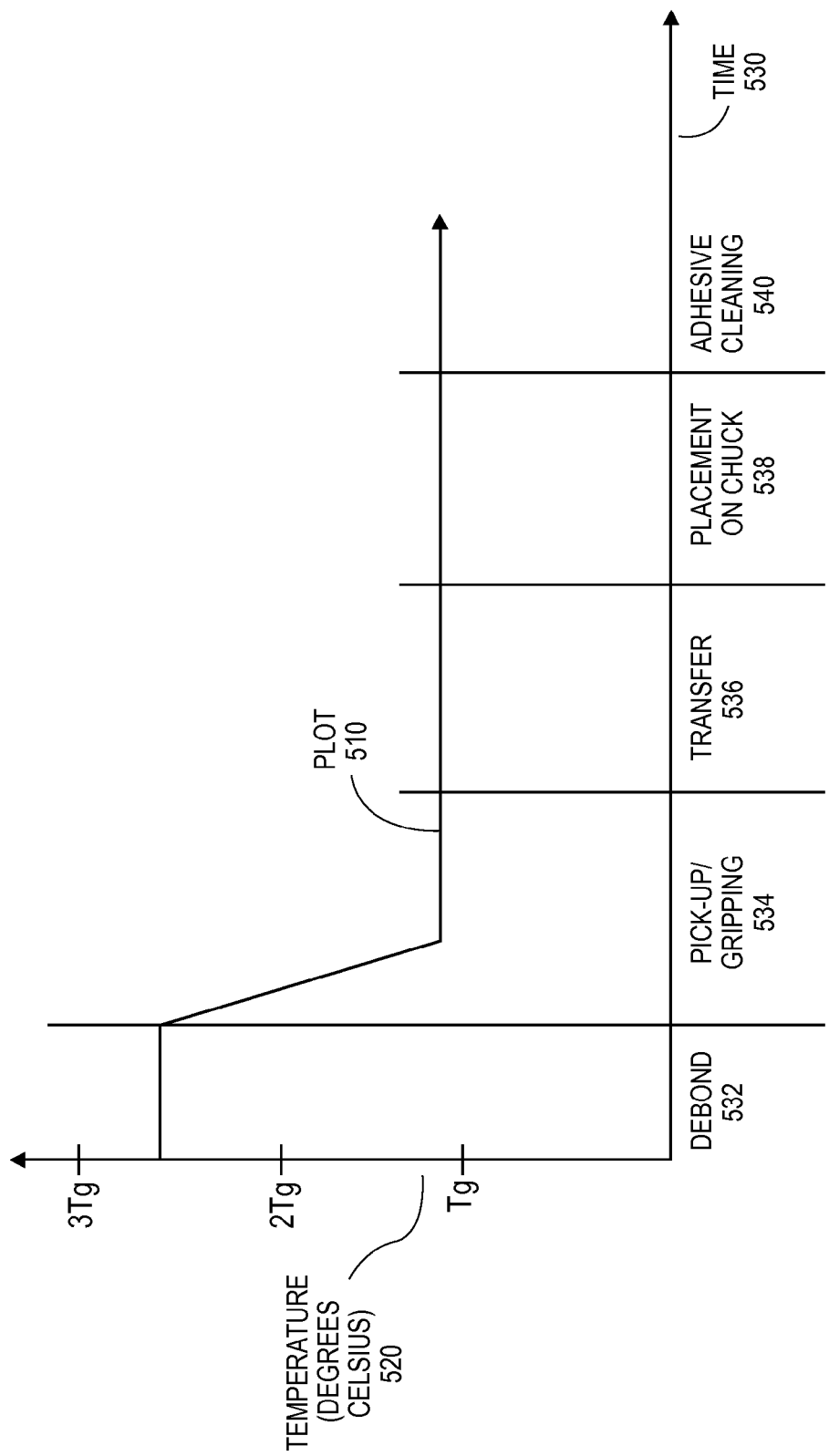
FIG. 5 shows an example of a plot of wafer temperature versus time or process for gripping an electronic device wafer with a heated gripper, and transferring the device wafer to a heated adhesive cleaning chuck.

FIG. 5 shows an example of a plot of wafer temperature versus time or process for gripping an electronic device wafer with a heated gripper, and transferring the device wafer to a heated adhesive cleaning chuck. FIG. 5 shows plot 510 of wafer temperature 520 (e.g., temperature of surface 117 or adhesive 122) versus time 530 during a process that includes debonding of wafer 110 (e.g., process 100; FIG. 1A; and/or block 210); gripping (e.g., process 130; FIG. 1B; and/or block 220) and transfer of wafer 110 (e.g., process 141; FIGS. 1C and/or 1D; and/or blocks 230 and 240), placing wafer 110 on cleaning chuck 152 (e.g., process 150 and 157; FIGS. 1E and/or 1G; and/or block 250), and cleaning of adhesive from wafer 110 (e.g., process 160; FIG. 1H; and/or block 260).

FIG. 5 shows period 532 during debonding of wafer 110, period 534 during gripping of wafer 110 by gripper 132, period 536 during inverting and transferring of wafer 110 by gripper 132, period 538 during placement 110 on chuck 152, and period 540 during cleaning of adhesive from surface 117 of wafer 110. During period 532 the temperature of the wafer (e.g. surface 117 or adhesive 122) may be heated to or at a temperature of between 2×Tg and 3×Tg, such as due to heating during the debonding process. In some cases, during debonding, the wafer temperature may be maintained at approximately between 2 to 3 times the Tg. In some cases, heating during debonding period 532 is maintained until gripping by heated gripper 132 or until period 134 begins. At the termination of debonding, while the wafer is at this temperature, the gripper may pick up the wafer and period 534 may begin.

During period 534 the temperature of the device wafer (e.g. surface 117 or adhesive 122) is reduced or transitions from 220 and 300 degrees Celsius to one of (1) a glass transition temperature (Tg) of the adhesive plus or minus 10 or 25 percent of the glass transition temperature (Tg) of the adhesive, and (2) between 0.5 and 3 times the Tg of the adhesive, such as due to heating the wafer using gripper 132 after the wafer is gripped and no longer heated during debond. In some cases, during gripping, the wafer temperature may be maintained at, but not drop below one of (1) a glass transition temperature (Tg) of the adhesive plus or minus 25 percent of the glass transition temperature (Tg) of the adhesive, and (2) between 0.5 and 3 times the Tg of the adhesive. In some cases, the gripper heats the wafer to as noted for FIG. 1D. In some cases, heating during period 534 is maintained until period 536 begins. At the termination of gripping, while the wafer is at this temperature, the gripper may pick up the wafer and period 536 may begin.

During period 536 the temperature of the device wafer (e.g. surface 117 or adhesive 122) is maintained from period 534 one of (1) a glass transition temperature (Tg) of the adhesive plus or minus 10 or 25 percent of the glass transition temperature (Tg) of the adhesive, and (2) between 0.5 and 3 times the Tg of the adhesive, such as due to heating the wafer using heated gripper 132. In some cases, during transferring, the wafer temperature may be maintained at, but not drop below approximately one of (1) a glass transition temperature (Tg) of the adhesive plus or minus 10 or 25 percent of the glass transition temperature (Tg) of the adhesive, and (2) between 0.5 and 3 times the Tg of the adhesive. In some cases, the gripper heats the wafer to as noted for FIG. 1D. In some cases, heating during period 536 is maintained until period 538 begins. At the termination of transferring, while the wafer is at this temperature, the gripper may deposit the wafer and period 538 may begin.

During period 538 the temperature of the device wafer (e.g. surface 117 or adhesive 122) is maintained from period 536 at one of (1) a glass transition temperature (Tg) of the adhesive plus or minus 10 or 25 percent of the glass transition temperature (Tg) of the adhesive, and (2) between 0.5 and 3 times the Tg of the adhesive, such as due to heating the wafer using heated chuck 152 after the wafer is deposited and no longer heated by gripper 132 (e.g., during transfer and deposition onto chuck 152). In some cases, during deposition, the wafer temperature may be maintained at, but not drop below approximately one of (1) a glass transition temperature (Tg) of the adhesive plus or minus 10 or 25 percent of the glass transition temperature (Tg) of the adhesive, and (2) between 0.5 and 3 times the Tg of the adhesive. In some cases, chuck 152 heats the wafer to as noted for FIG. 1G. In some cases, heating during period 538 is maintained until period 540 begins. At the termination of deposition, while the wafer is at this temperature, the adhesive may be dissolved or cleaned off and period 540 may begin.

During period 540 the temperature of the device wafer (e.g. surface 117 or adhesive 122) is maintained from period 538 at one of (1) a glass transition temperature (Tg) of the adhesive plus or minus 10 or 25 percent of the glass transition temperature (Tg) of the adhesive, and (2) between 0.5 and 3 times the Tg of the adhesive, such as due to heating the wafer using heated gripper 132. In some cases, during cleaning, the wafer temperature may be maintained at, but not drop below approximately one of (1) a glass transition temperature (Tg) of the adhesive plus or minus 10 or 25 percent of the glass transition temperature (Tg) of the adhesive, and (2) between 0.5 and 3 times the Tg of the adhesive, until all or a most of thickness T2 of adhesive 122 is dissolved or cleaned off of surface 117.

Figure 6A:
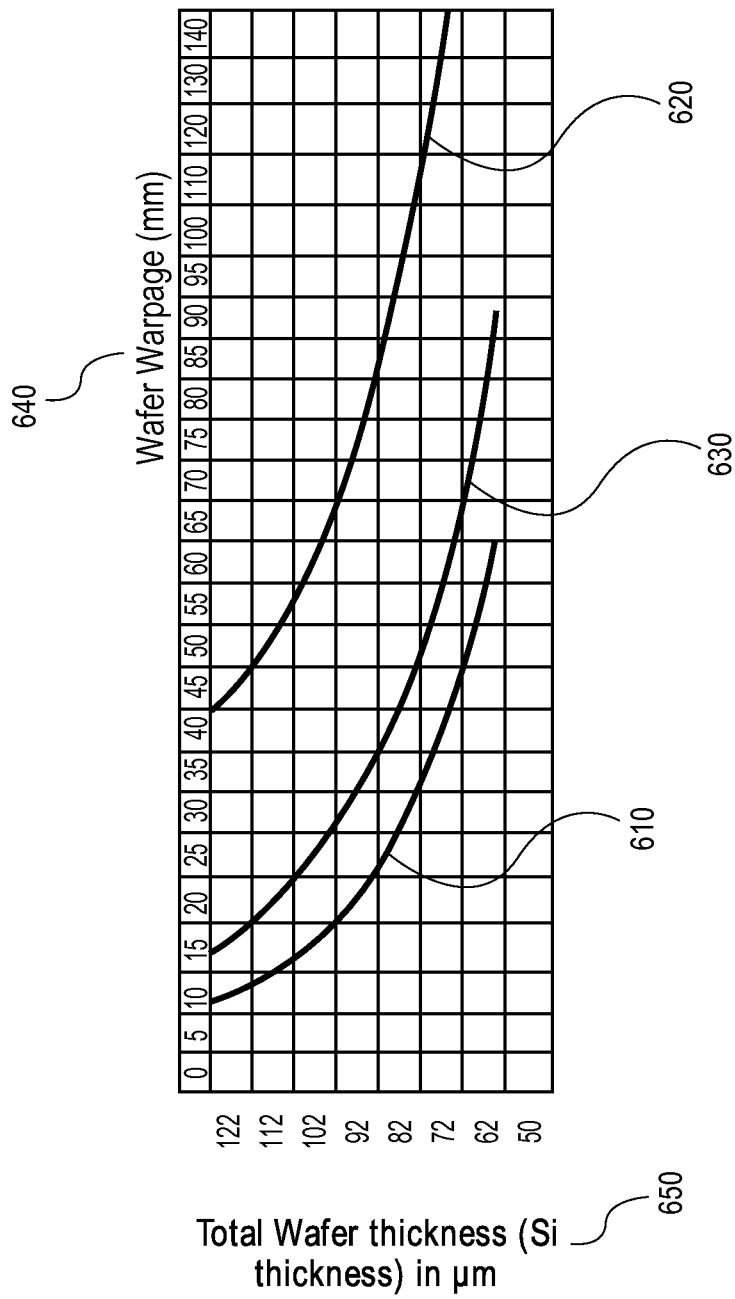
FIG. 6A shows an example of a plot of expected wafer warpage versus wafer thickness during thin wafer handling and deposition onto a cleaning chuck, for embodiments that do and do not use a heated gripper or a heated adhesive cleaning chuck.

FIG. 6A shows an example of a plot of expected wafer warpage versus wafer thickness for an embodiment that does not use a heated gripper or a heated adhesive cleaning chuck. FIG. 6A may show actual experimental data; and modeling or simulated data based on the 122 micrometer thickness wafer experimental data. FIG. 6A shows plot 610 of actual experimental warpage of a wafer without heated gripper 132 or heated chuck 152 for a wafer without adhesives (e.g., without layer 122). Plot 620 shows actual experimental warpage of a wafer without heated gripper 132 or heated chuck 152 for a wafer with adhesive (e.g., with layer 122, such as for the example shown in FIGS. 1C, 1F and 4A).

Plot 630 shows modeled or simulated warpage (e.g., based on actual experimental warpage of a wafer without the heated gripper) of a wafer with heated gripper 132 or heated chuck 152 for a wafer with adhesive (e.g., with layer 122, such as for the example shown in FIGS. 1D and 1G). Plots 610, 620 and 630 are shown with respect to various total wafer thicknesses 650 in micrometers (um) versus wafer warpage (mm) 640. FIG. 6A may show that a heated 132 and/or chuck 152 can significantly help in improve handling of the wafer by reducing wafer warpage due to adhesive cooling; and improve performance of the handling and cleaning equipment by increasing a holding or vacuum seal of the gripper and of the cleaning chuck.

Figure 6B:
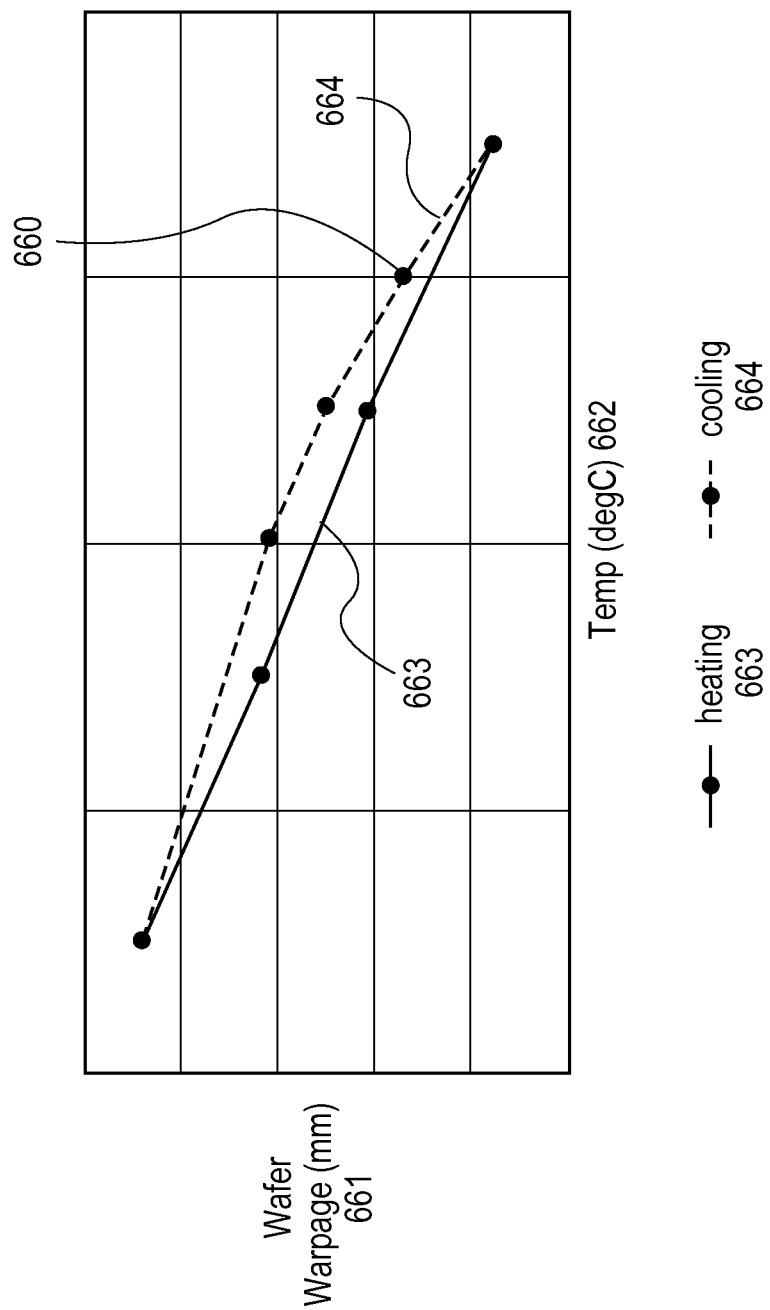
FIG. 6B shows an example of a plot of wafer warpage change versus temperature cycling for thin wafers.

FIG. 6B shows an example of a plot of wafer warpage change versus temperature cycling for thin wafers. FIG. 6B plot 660 of wafer warpage change 661 in mm versus temperature cycling degrees Celsius 662 for thin wafers. FIG. 6B may be an example of a plot of wafer warpage 660 showing warpage change during a heating cycle 663 as compared to during a cooling cycle 664 for a wafer such as wafer 110.

FIG. 6B may show actual experimental data indicating that warpage amount (e.g., W1 or W2) are not the same or equal during heating as compared to cooling. Specifically there is an increased amount of warpage during cooling cycle 664 as compared to heating cycle 663. Thus, in some cases, it may be desired to maintain or increase wafer temperature (e.g., as described herein) instead of letting the wafer cool, or instead of cycling between cooling and heating.

Figure 7:
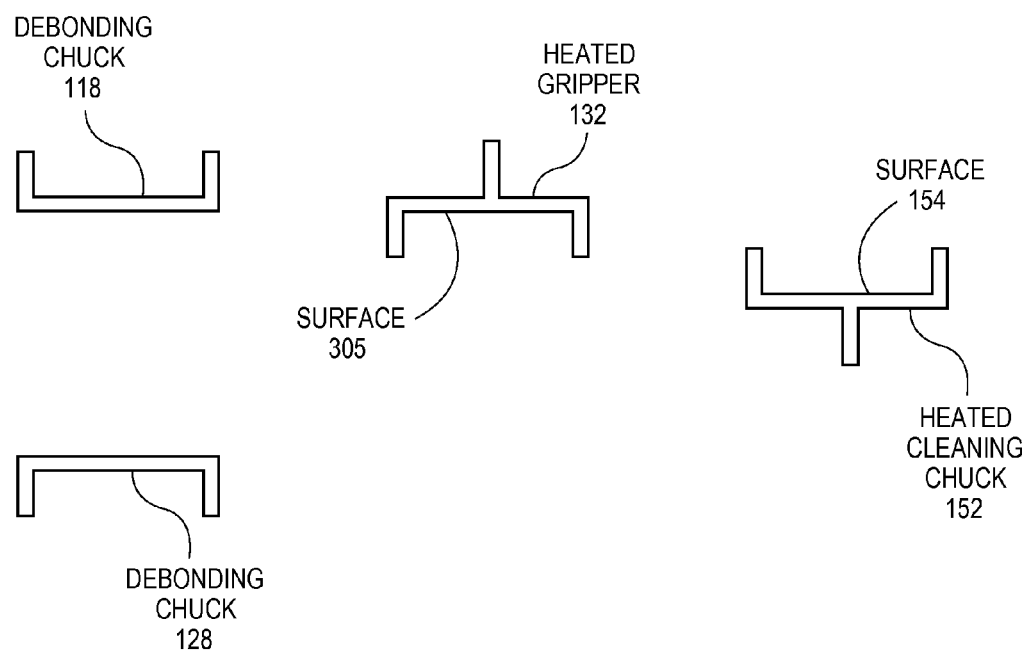
FIG. 7 is a system for embodiments that include a heated gripper and a heated adhesive cleaning chuck.

FIG. 7 is a system for embodiments that include a heated gripper and a heated adhesive cleaning chuck. FIG. 7 shows system 700 including debonding chucks 118 and 128 for debonding wafer 110 from carrier 120, such as described for one or more of blocks 210 and 220. FIG. 7 shows heated device wafer handling gripper 132 for gripping, transferring and depositing wafer 110 onto a cleaning chuck, such as described for one or more of blocks 220 through 250. FIG. 7 shows heated device wafer adhesive cleaning chuck 152 for gripping and cleaning adhesive 122 from wafer 110, such as described for one or more of blocks 250 through 270. In some cases, system 700 includes only gripper 132 or chuck 152. In some cases, system 700 includes only gripper 132 and chuck 152.

According to embodiments, the descriptions above for FIG. 1-7 can be applied to other types of wafer processing, such as wafers comprising substrates that are or include material other than silicon.

EXAMPLES

The following examples pertain to embodiments.

Example 1 is a method to handle a debonded device wafer comprising: thermo-slide debonding an electronic device wafer from a carrier by separating the device wafer from the carrier along a layer of temporary bonding adhesive that bonds the device wafer and carrier, wherein a residue of the adhesive remains on a bottom surface of the device wafer after debonding; gripping the bottom surface of the device wafer with a heated non-contact wafer handling gripper, wherein gripping includes forming a holding force between the device wafer and the gripper; transferring the device wafer to an adhesive cleaning chuck; and placing a top side of the device wafer onto an adhesive cleaning chuck, wherein placing includes forming a vacuum between the device wafer and the adhesive cleaning chuck.

In Example 2, the subject matter of Example 1 can optionally include, wherein gripping, transferring and placing include heating the residue of the adhesive to one of (1) a glass transition temperature (Tg) of the adhesive plus or minus 25 percent of the glass transition temperature (Tg) of the adhesive, and (2) between 0.5 and 3 times the glass transition temperature (Tg) of the adhesive.

In Example 3, the subject matter of Example 1 can optionally include, wherein gripping, transferring and placing include heating the wafer during gripping, transferring and placing by heating a bottom surface of the gripper that is carrying the device wafer using a heater built into the gripper or a heater mounted on a top surface gripper to heat an adhesive layer of the device wafer.

In Example 4, the subject matter of Example 1 can optionally include, wherein gripping, transferring and placing include heating the wafer during gripping, transferring and placing by heating a vacuum gas expelled by the gripper and that comes in contact with the bottom surface of the device wafer.

In Example 5, the subject matter of Example 1 can optionally include, wherein placing includes heating an adhesive layer of the device wafer during placing by heating a top surface of the cleaning chuck that the device wafer is placed upon using a heater built into the cleaning chuck.

In Example 6, the subject matter of Example 1 can optionally include, wherein placing includes heating the residue of the adhesive to one of (1) a glass transition temperature (Tg) of the adhesive plus or minus 25 percent of the glass transition temperature (Tg) of the adhesive, and (2) between 0.5 and 3 times the glass transition temperature (Tg) of the adhesive.

In Example 7, the subject matter of Example 1 can optionally include, wherein the electronic device wafer has a layer of electronic devices on a substrate, the layer of temporary bonding adhesive below the substrate, and a layer of metal interconnects over the layer of electronic devices.

In Example 8, the subject matter of Example 1 can optionally include, wherein gripping includes gripping the bottom surface of the device wafer and the residue of the adhesive by forming a vacuum between the bottom surface of the device wafer and the heated gripper by emitting gas from pods on the bottom surface of the heated gripper.

In Example 9, the subject matter of Example 1 can optionally include, wherein placing includes depositing the top surface of the device wafer onto a heated surface of a heated adhesive cleaning chuck, forming a vacuum between the top surface of the device wafer and the heated surface using openings in the heated surface, and removing the gripper to expose the residue of the adhesive.

In Example 10, the subject matter of Example 10 can optionally include, further comprising cleaning the residue of adhesive off of the bottom surface of the device wafer by exposing the adhesive to a solvent while holding the device wafer with the heated adhesive cleaning chuck.

Example 11, is a heated non-contact wafer handling gripper comprising: a bottom surface having pods for emitting gas to form a vacuum between the bottom surface of the gripper and a surface of a device wafer; and a heater to heat the bottom surface of the gripper.

In Example 12, the subject matter of Example 11 can optionally include, wherein the heater includes sufficient heating to heat the surface of the device wafer to one of (1)

a glass transition temperature (Tg) of the adhesive plus or minus 25 percent of the glass transition temperature (Tg) of the adhesive, and (2) between 0.5 and 3 times the Tg of the adhesive.

In Example 13, the subject matter of Example 11 can optionally include, wherein the heater includes one of a heater built into the gripper or a heater mounted on a top surface gripper to heat the surface of the wafer.

In Example 14, the subject matter of Example 11 can optionally include, wherein the heater includes a heater to heat a vacuum gas expelled by the gripper and that comes in contact with the surface of the wafer (1) to heat the surface of the wafer, and (2) to form a holding force between the wafer and the gripper.

Example 15 is a heated adhesive cleaning chuck comprising: a top surface having openings for sucking in air or an ambient gas to form a vacuum between the top surface of the handler and a surface of a device wafer; and a heater to heat the top surface of the handler.

In Example 16, the subject matter of Example 15 can optionally include, wherein the heater includes sufficient heating to heat the surface of the device wafer to one of (1) a glass transition temperature (Tg) of the adhesive plus or minus 25 percent of the glass transition temperature (Tg) of the adhesive, and (2) between 0.5 and 3 times the Tg of the adhesive.

In Example 17, the subject matter of Example 15 can optionally include, wherein the heater includes a heater built into the chuck or a heater mounted below the top surface chuck to heat the surface of the wafer.

Example 18, is a system for handling a debonded device wafer comprising: a heated non-contact wafer handling gripper having a bottom surface having pods for emitting gas to form a vacuum between the bottom surface of the gripper and a surface of a device wafer to grip the wafer, and a gripper heater to heat the bottom surface of the gripper; and a heated adhesive cleaning chuck having a top surface having openings for sucking in air or an ambient gas to form a vacuum between the top surface of the handler and a surface of a device wafer, and a chuck heater to heat the top surface of the handler.

In Example 19, the subject matter of Example 18 can optionally include, wherein the gripper heater includes a heater to heat a bottom surface of a device wafer while the gripper grips a bottom surface of the device wafer, transfers the device wafer to the heated adhesive cleaning chuck, and places a top surface of the device wafer onto the heated adhesive cleaning chuck.

In Example 20, the subject matter of Example 18 can optionally include, further comprising: a first debond chuck to attach to a top surface of the device wafer to slide the device wafer away from a carrier along a layer of temporary bonding adhesive, prior to forming a vacuum between the bottom surface of the gripper and a surface of a device wafer; and a second debond chuck to attach to a bottom surface of the carrier to hold the carrier.

In Example 21, the subject matter of Example 18 can optionally include, wherein the gripper heater includes a heating element to heat the bottom surface of the device wafer to one of (1) a glass transition temperature (Tg) of the adhesive plus or minus 25 percent of the glass transition temperature (Tg) of the adhesive, and (2) between 0.5 and 3 times the Tg of the adhesive, and wherein the chuck heater includes a heating element to heat the bottom surface of the device wafer to one of (1) a glass transition temperature (Tg) of the adhesive plus or minus 25 percent of the glass transition temperature (Tg) of the adhesive, and (2) between 0.5 and 3 times the Tg of the adhesive.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit embodiments of the invention but to illustrate it. The scope of the embodiments of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the embodiments. Similarly, it should be appreciated that in the description various features are sometimes grouped together in a single embodiment, figure, or description thereof for the purpose of streamlining the disclosure and aiding in the understanding of various inventive aspects of embodiments. This method of disclosure, however, is not to be interpreted as reflecting an embodiment that requires more features than are expressly recited in each claim. Rather, as the following claims reflect, inventive aspects of embodiments that may lie in less than all features of a single disclosed embodiment. For example, although the descriptions and figures above describe using a heated gripper and/or chuck, it may be possible to heat the wafer or adhesive as noted above, using other devices or processes, such as using heating lamps mounted in the room or using heated air or gas in the room. Thus, the claims following the Detailed Description are hereby expressly incorporated into this Detailed Description, with each claim standing on its own as a separate embodiment of the invention.

What is claimed is:

1. A heated non-contact wafer handling gripper comprising:
    a bottom surface having pods for emitting gas to form a vacuum between the bottom surface of the gripper and a surface of a device wafer, the vacuum to cause the bottom surface of the gripper to (1) hold and move the device wafer (2) without being in physical contact with the surface of the device wafer; and
    a heater to heat the bottom surface of the gripper.

2. The gripper of claim 1, wherein the heater includes sufficient heating to heat the surface of the device wafer to one of (1) a glass transition temperature (Tg) of the adhesive plus or minus 25 percent of the glass transition temperature (Tg) of the adhesive, and (2) between 0.5 and 3 times the Tg of the adhesive.

3. The gripper of claim 1, wherein the heater includes one of a heater built into the gripper or a heater mounted on a top surface gripper to heat the surface of the wafer.

4. The gripper of claim 1, wherein the heater includes a heater to heat a vacuum gas expelled by the gripper and that comes in contact with the surface of the wafer (1) to heat the surface of the wafer, and (2) to form a holding force between the wafer and the gripper.

5. A heated adhesive cleaning chuck comprising:
a top surface having openings for sucking in air or an ambient gas to form a vacuum between the top surface of the handler and a surface of a device wafer, the vacuum to cause the top surface of the chuck to (1) hold and move the device wafer (2) while being in physical contact with the surface of the device wafer; and
a heater to heat the top surface of the handler.

6. The chuck of claim 5, wherein the heater includes sufficient heating to heat the surface of the device wafer to one of (1) a glass transition temperature (Tg) of the adhesive plus or minus 25 percent of the glass transition temperature (Tg) of the adhesive, and (2) between 0.5 and 3 times the Tg of the adhesive.

7. The chuck of claim 5, wherein the heater includes a heater built into the chuck or a heater mounted below the top surface chuck to heat the surface of the wafer.

8. A system for handling a debonded device wafer comprising:
a heated non-contact wafer handling gripper having a bottom surface having pods for emitting gas to form a vacuum between the bottom surface of the gripper and a surface of a device wafer to grip the wafer, and a gripper heater to heat the bottom surface of the gripper; and
a heated adhesive cleaning chuck having a top surface having openings for sucking in air or an ambient gas to form a vacuum between the top surface of the handler and a surface of a device wafer, and a chuck heater to heat the top surface of the handler.

9. The system of claim 8, wherein the gripper heater includes a heater to heat a bottom surface of a device wafer while the gripper grips a bottom surface of the device wafer, transfers the device wafer to the heated adhesive cleaning chuck, and places a top surface of the device wafer onto the heated adhesive cleaning chuck.

10. The system of claim 8, further comprising:
a first debond chuck to attach to a top surface of the device wafer to slide the device wafer away from a carrier along a layer of temporary bonding adhesive, prior to forming a vacuum between the bottom surface of the gripper and a surface of a device wafer; and
a second debond chuck to attach to a bottom surface of the carrier to hold the carrier.

11. The system of claim 8, wherein the gripper heater includes a heating element to heat the bottom surface of the device wafer to one of (1) a glass transition temperature (Tg) of the adhesive plus or minus 25 percent of the glass transition temperature (Tg) of the adhesive, and (2) between 0.5 and 3 times the Tg of the adhesive, and wherein the chuck heater includes a heating element to heat the bottom surface of the device wafer to one of (1) a glass transition temperature (Tg) of the adhesive plus or minus 25 percent of the glass transition temperature (Tg) of the adhesive, and (2) between 0.5 and 3 times the Tg of the adhesive.

12. The gripper of claim 1, having a sufficient number of pods and vacuum to have the bottom surface of the gripper (1) hold and invert the device wafer (2) without being in physical contact with the surface of the device wafer.

13. The gripper of claim 1, wherein the pods are one of divergent type, "Bernoulli", vortex type, or rotating flow gas emitting nozzles.

14. The gripper of claim 1, wherein the pods are located at gripping locations on a gripping surface of the bottom surface of the gripper to grip and move the wafer without the need of physical contact between the surface of the device wafer and the gripper.

15. The chuck of claim 5, having a sufficient number of openings and vacuum to have the top surface of the chuck (1) hold and clean adhesive from the top surface of the device wafer (2) while being in physical contact with the top surface of the device wafer.

16. The gripper of claim 1, wherein the openings form an electrostatic chuck (ESC) attraction between the top surface of the chuck an the device wafer.

17. The gripper of claim 1, wherein the openings include channels or a porous surface facing the device wafer of the chuck created by sucking in air or ambient gas through the vacuum channels or porous surface.

18. The system of claim 8, the gripper having a sufficient number of pods and vacuum to have the bottom surface of the gripper (1) hold and invert the device wafer (2) without being in physical contact with the surface of the device wafer; and the chuck having a sufficient number of openings and vacuum to have the top surface of the chuck (1) hold and clean the device wafer (2) while being in physical contact with the surface of the device wafer.

19. The system of claim 8, wherein the pods are one of divergent type, "Bernoulli", vortex type, or rotating flow gas emitting nozzles.

20. The system of claim 8, wherein the pods are located at gripping locations on a gripping surface of the bottom surface of the gripper to grip and move the wafer without the need of physical contact between the surface of the device wafer and the gripper.

* * * * *